(12) United States Patent
Lee et al.

(10) Patent No.: US 11,758,788 B2
(45) Date of Patent: Sep. 12, 2023

(54) METHOD OF MANUFACTURING DISPLAY PANEL WITH COLOR CONTROL LAYER INCLUDING WALL BASES HAVING REFLECTIVE LAYERS ON SIDEWALLS THEREOF

(71) Applicant: Samsung Display Co., Ltd., Yongin-Si (KR)

(72) Inventors: Seon Uk Lee, Seongnam-si (KR); Kanguk Kim, Hwaseong-si (KR); Sanggab Kim, Seoul (KR); Donchan Cho, Seongnam-si (KR); Tae Hyung Hwang, Seoul (KR); KyeongSu Ko, Hwaseong-si (KR); Sungwon Cho, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/951,200

(22) Filed: Sep. 23, 2022

(65) Prior Publication Data
US 2023/0017737 A1 Jan. 19, 2023

Related U.S. Application Data

(63) Continuation of application No. 16/850,046, filed on Apr. 16, 2020, now Pat. No. 11,456,338.

(30) Foreign Application Priority Data

May 21, 2019 (KR) .......................... 10-2019-0059541
Dec. 12, 2019 (KR) .......................... 10-2019-0165955

(51) Int. Cl.
*H10K 59/38* (2023.01)
*H10K 50/84* (2023.01)
(Continued)

(52) U.S. Cl.
CPC .......... *H10K 59/38* (2023.02); *H10K 50/841* (2023.02); *H10K 50/856* (2023.02);
(Continued)

(58) Field of Classification Search
CPC .. H10K 50/841; H10K 50/842; H10K 50/856; H10K 50/865; H10K 59/38;
(Continued)

(56) References Cited

U.S. PATENT DOCUMENTS 9,971,198 B2    5/2018   Cho et al.
10,185,066 B2   1/2019   Chae et al.
(Continued)

FOREIGN PATENT DOCUMENTS

JP      5213257 B2       6/2013
JP      2017-161604 A    9/2017
(Continued)

*Primary Examiner* — Matthew E. Gordon
(74) *Attorney, Agent, or Firm* — Innovation Counsel LLP

(57) ABSTRACT

Disclosed are display panels and methods of manufacturing substrates. The display panel comprises a lower display substrate that includes a plurality of light emitting elements, and an upper display substrate that includes a color control layer and is on the lower display substrate. The color control layer includes a plurality of walls each of which includes a wall base including an organic material and a reflective layer including a metallic material, and the color control layer also includes a plurality of color control parts which are disposed between the plurality of walls and at least one of which includes a quantum dot. The reflective layer surrounds at least a portion of a sidewall of the wall base, which results in an increase in luminous efficiency and an improvement in brightness.

12 Claims, 20 Drawing Sheets

(51) Int. Cl.
*H10K 50/856* (2023.01)
*H10K 50/86* (2023.01)
*H10K 59/122* (2023.01)
*H10K 59/126* (2023.01)
*H10K 71/00* (2023.01)

(52) U.S. Cl.
CPC ......... *H10K 50/865* (2023.02); *H10K 59/122* (2023.02); *H10K 59/126* (2023.02); *H10K 71/00* (2023.02)

(58) Field of Classification Search
CPC .. H10K 59/871; H10K 59/872; H10K 59/122; H10K 59/126; H10K 59/8791; H10K 59/878; H10K 59/8792; H10K 71/00; H10K 71/40; H10K 71/421; H10K 71/441
USPC .......................................................... 257/88
See application file for complete search history.

(56) References Cited

U.S. PATENT DOCUMENTS

| | | | | |
|---|---|---|---|---|
| 2016/0372528 | A1* | 12/2016 | Kamura | H01L 31/055 |
| 2017/0125740 | A1* | 5/2017 | Lee | H10K 50/856 |
| 2020/0144557 | A1* | 5/2020 | Du | H10K 59/122 |

FOREIGN PATENT DOCUMENTS

| | | |
|---|---|---|
| KR | 10-2014-0074495 A | 6/2014 |
| KR | 10-2018-0018945 A | 2/2018 |
| KR | 10-2020-0004483 A | 1/2020 |

\* cited by examiner ated display panel and a method of manufacturing a substrate included in the display panel, and more particularly, to a display panel including a color conversion layer with improved optical characteristics and a method of manufacturing a substrate.

METHOD OF MANUFACTURING DISPLAY PANEL WITH COLOR CONTROL LAYER INCLUDING WALL BASES HAVING REFLECTIVE LAYERS ON SIDEWALLS THEREOF

CROSS-REFERENCE TO RELATED APPLICATIONS

This application is a continuation application of U.S. patent application Ser. No. 16/850,046 filed on Apr. 16, 2020, which claims priority under 35 U.S.C § 119 to Korean Patent Application Nos. 10-2019-0059541 filed on May 21, 2019, and 10-2019-0165955 filed on Dec. 12, 2019, in the Korean Intellectual Property Office, the disclosures of which are hereby incorporated by reference in their entirety.

BACKGROUND

The present inventive concepts relate to a display panel and a method of manufacturing a substrate included in the display panel, and more particularly, to a display panel including a color conversion layer with improved optical characteristics and a method of manufacturing a substrate.

Various display devices are being developed for use in multimedia devices, such as smartphones, tablet computers, television sets, navigation systems, and game consoles. A color conversion layer including quantum-dot illuminants has been developed to improve color reproduction and viewing angle of the display device.

It is needed to pattern a color control part including quantum-dots when the color conversion layer is formed, and a wall is used to distinguish the color control parts from each other when the color control part is patterned.

The display device has a problem of reduced brightness because the wall absorbs or insufficiently reflects light emitted from the color control part. To increase brightness, it is required to improve the quality of the wall.

SUMMARY

Some example embodiments of the present inventive concepts provide a display panel with improved brightness.

Some example embodiments of the present inventive concepts provide a method of manufacturing a substrate, which method can improve brightness.

According to some example embodiments of the present inventive concepts, a display panel may comprise: a lower display substrate that includes a plurality of light emitting elements; and an upper display substrate that includes a color control layer and is on the lower display substrate. The color control layer may include: a plurality of walls each of which includes a wall base including an organic material and a reflective layer including a metallic material; and a plurality of color control parts disposed between the plurality of walls, at least one of the plurality of color control parts including a quantum dot. The reflective layer may surround at least a portion of a sidewall of the wall base.

In an embodiment, the sidewall of the wall base may be formed to have a reversely tapered shape along a direction perpendicular to the lower display substrate.

In an embodiment, the display panel may further include a spacer layer which including an inorganic material. When viewed in a direction perpendicular to the lower display substrate, the wall base may have a first height, the reflective layer may have a second height less than the first height, and the spacer layer may have a third height less than the first height.

In an embodiment, the reflective layer may be disposed between the wall base and the spacer layer.

In an embodiment, the spacer layer may be disposed between the wall base and the reflective layer.

In an embodiment, the display panel may further comprise an outer spacer layer that surrounds the reflective layer.

In an embodiment, the spacer layer and the outer spacer layer may include different materials from each other.

In an embodiment, the spacer layer may include at least one of silicon oxide, silicon nitride, silicon oxynitride, indium tin oxide, and indium zinc oxide.

In an embodiment, the wall base may include a first-floor wall and a second-floor wall.

In an embodiment, the first-floor wall and the second-floor wall may be in direct contact with each other.

In an embodiment, either the spacer layer or the reflective layer may be disposed between the first-floor wall and the second-floor wall.

In an embodiment, the spacer layer and the reflective layer may surround the first-floor wall.

In an embodiment, the spacer layer and the reflective layer may surround the first-floor wall and the second-floor wall.

In an embodiment, the upper display substrate may further include a color filter layer on the color control layer. The color filter layer may include: a plurality of light shielding layers that overlap the plurality of walls, respectively; and a plurality of color filters disposed between the plurality of light shielding layers.

According to some example embodiments of the present inventive concepts, a display panel may comprise: a lower display substrate that includes a plurality of light emitting elements; and an upper display substrate that includes a color control layer and is on the lower display substrate. The color control layer may include a wall. The wall may include a wall base and at least one functional layer, the wall base including an organic material. The wall base may include: a first surface parallel to the lower display substrate; a second surface parallel to the first surface and disposed closer than the first surface to the lower display substrate; and a third surface that connects the first surface to the second surface. The functional layer may include: a first sub-functional layer disposed adjacent to the third surface; and a second sub-functional layer that extends from the first sub-functional layer in a direction parallel to the first surface, the second sub-functional layer being disposed adjacent to the first surface.

In an embodiment, a width of the wall base may increase with decreasing distance from the lower display substrate.

In an embodiment, the function layer may include: a spacer layer including an inorganic material; and a reflective layer including a metallic material.

In an embodiment, the reflective layer may be disposed between the spacer layer and the third surface.

In an embodiment, the spacer layer may be disposed between the reflective layer and the third surface.

According to some example embodiments of the present inventive concepts, a method of manufacturing a substrate may comprise: forming an inorganic layer that includes an inorganic material on a base layer; forming a plurality of wall bases which are spaced apart from each other on the inorganic layer and which increase in width along a direction perpendicular to the inorganic layer; forming a reflective layer on the inorganic layer and the wall bases, the reflective layer including metal; forming a spacer layer on the reflective layer on the inorganic layer and the wall bases, the spacer layer including an inorganic material; removing a portion of the spacer layer; and removing a portion of the reflective layer.

DETAILED DESCRIPTION OF EMBODIMENTS

Figure 1A:
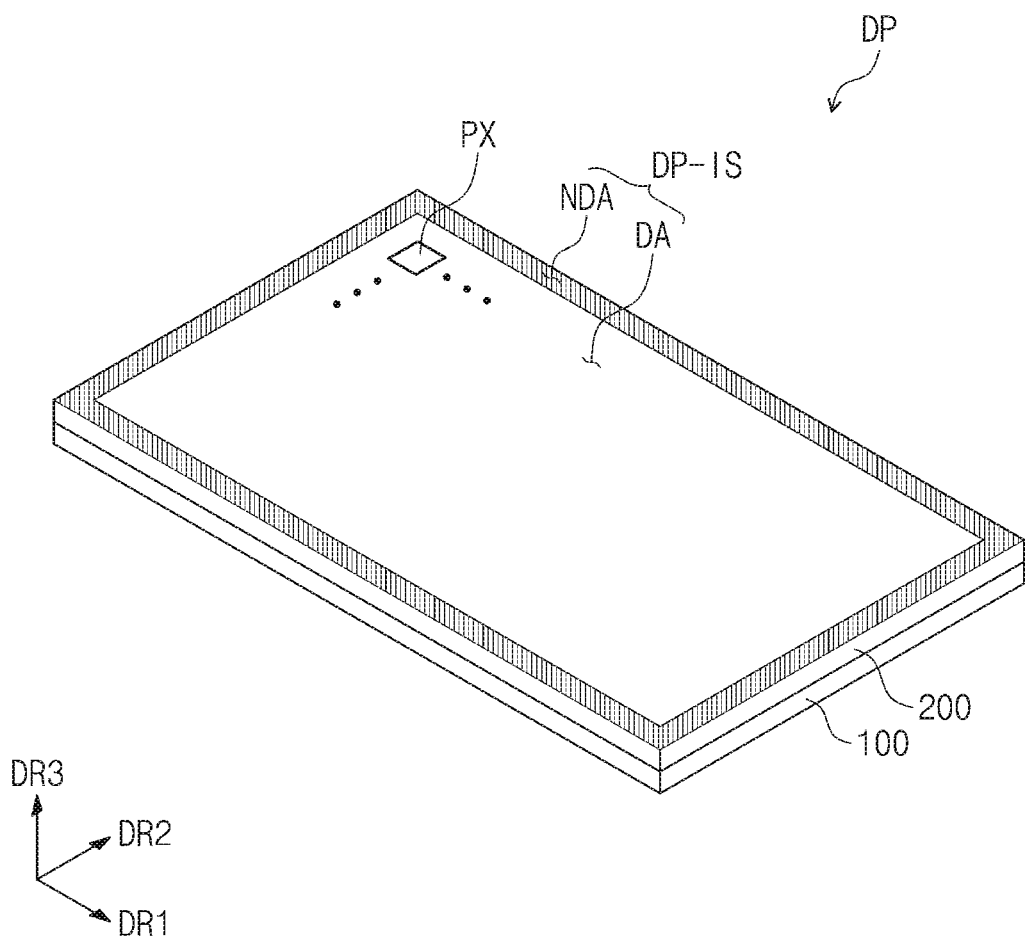
FIG. 1A illustrates a perspective view showing a display panel according to an embodiment.

While the present inventive concepts are open to various modifications and alternatives embodiments, specific embodiments thereof are shown by way of example in the drawings and will be described in detail. However, it should be understood that there is no intention to limit the present inventive concepts to the particular embodiments disclosed, but on the other hand, the present inventive concepts are to cover all modifications, equivalents, and alternatives falling within the spirit and scope thereof.

In this description, the phrase "directly disposed" may mean that no additional element, such a layer, a film, a region, or a plate, is present between a portion and other portion of a layer, a film, a region, a plate, or the like. For example, the phrase "directly disposed" may mean that no additional member such as an adhesive member is provided between two layers or members.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe a display panel DP and a method of manufacturing the display panel DP according to an embodiment of the present inventive concepts in conjunction with the accompanying drawings.

Figure 1B:
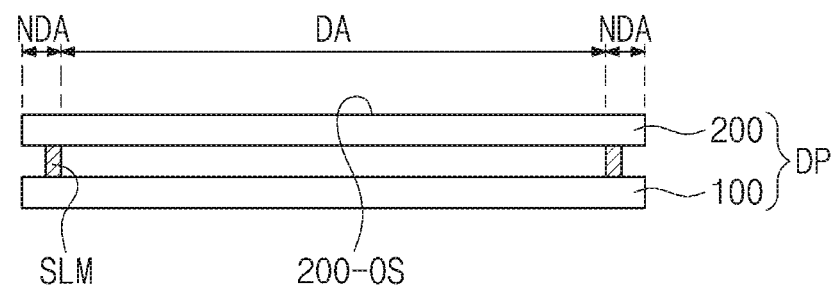
FIG. 1B illustrates a cross-sectional view showing a display panel according to an embodiment.
Figure 1B:
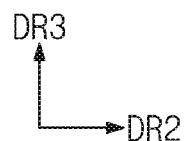
Figure 2:
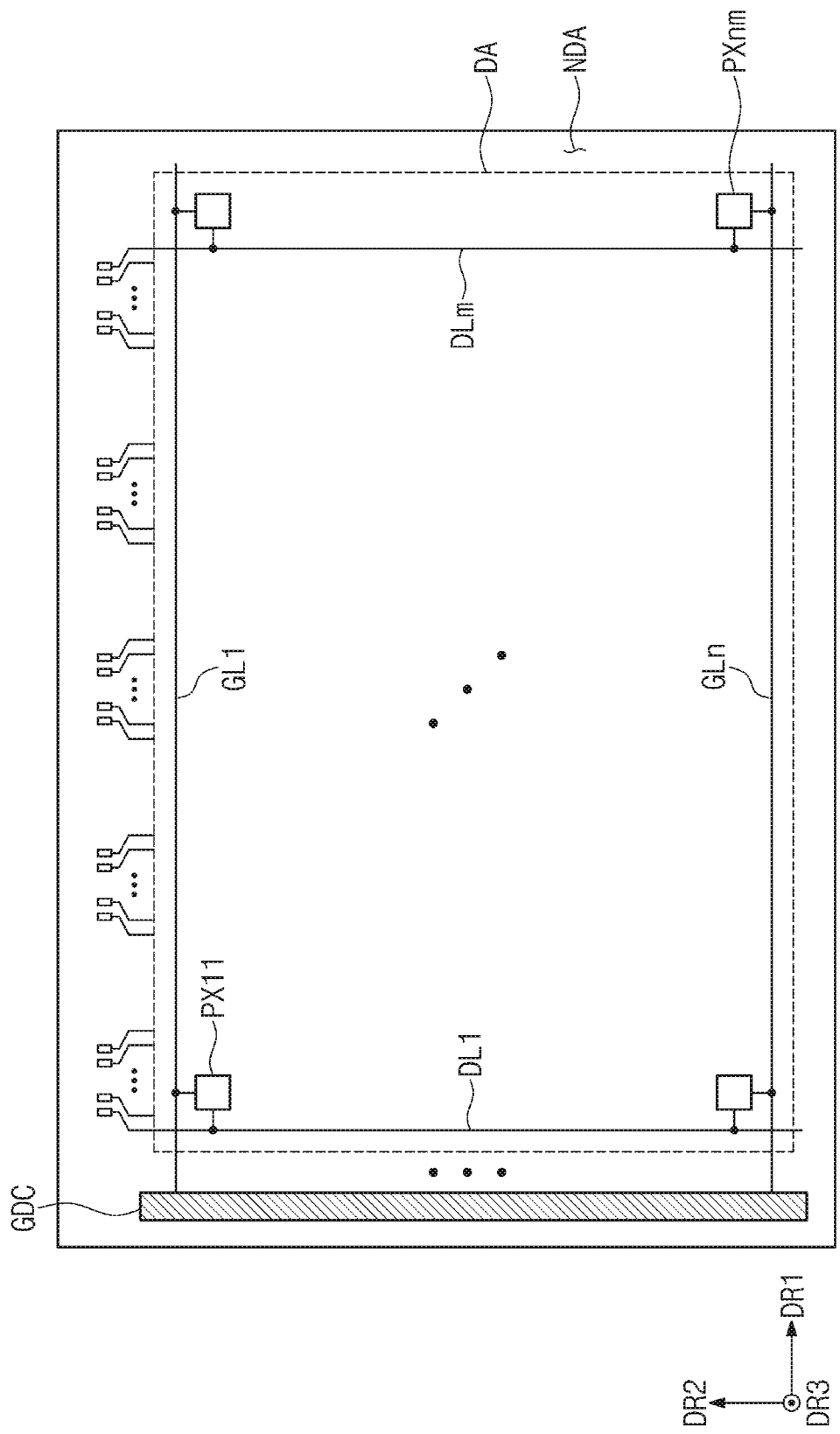
FIG. 2 illustrates a plan view showing a display panel according to an embodiment.
Figure 3:
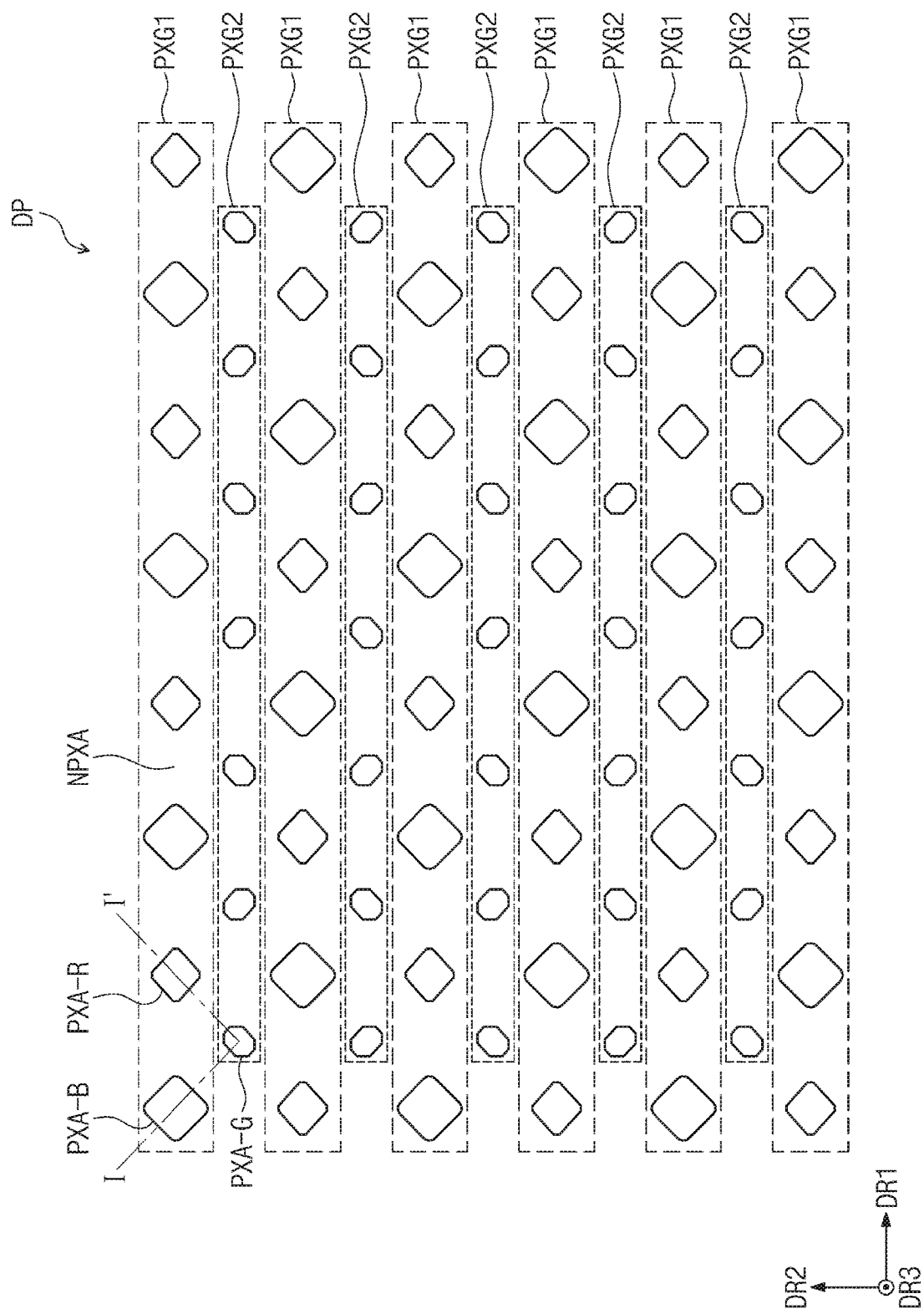
FIG. 3 illustrates a plan view partially showing a display panel according to an embodiment.
Figure 4A:
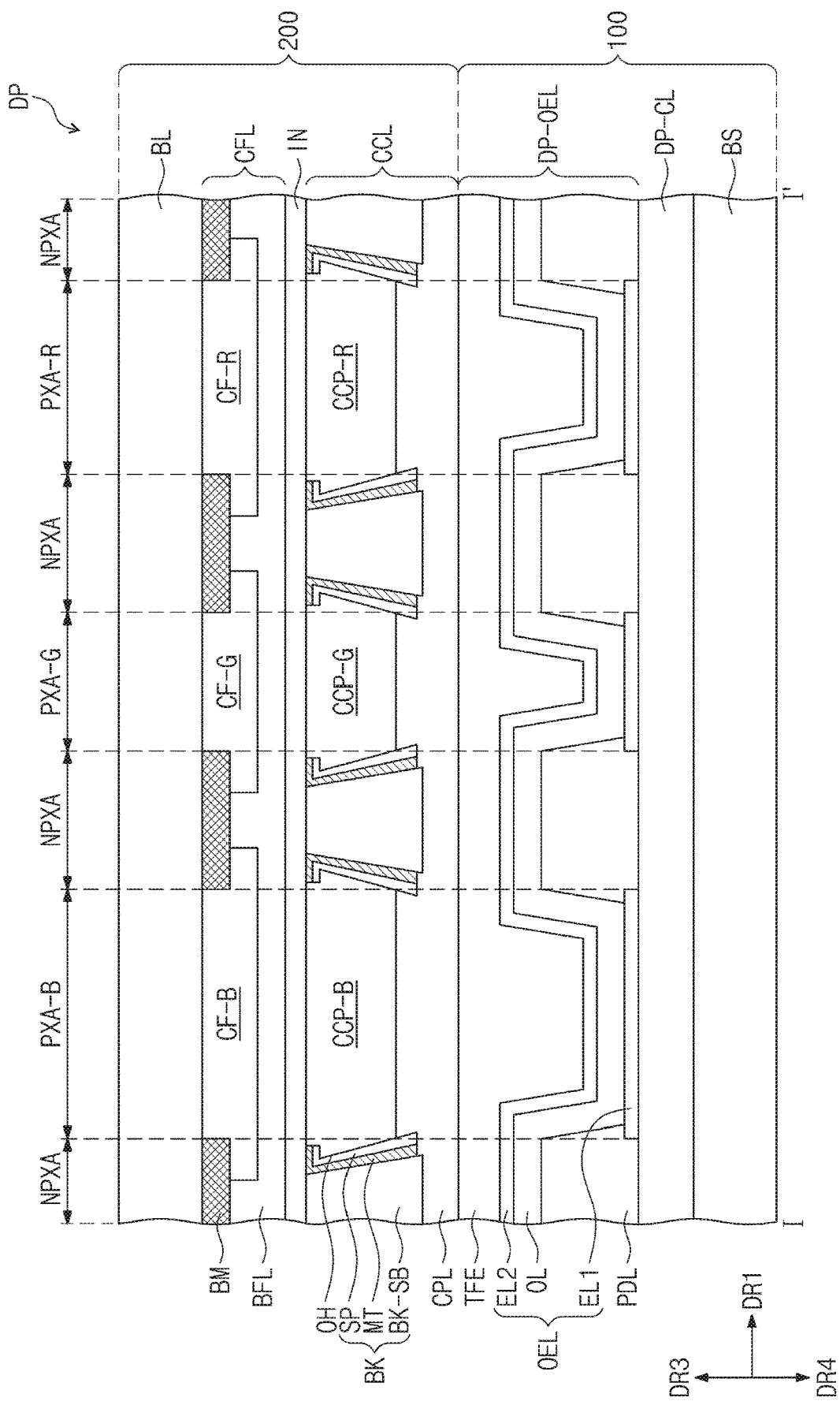
FIG. 4A illustrates a cross-sectional view taken along line I-I' of FIG. 3, showing a display panel according to an embodiment.
Figure 4B:
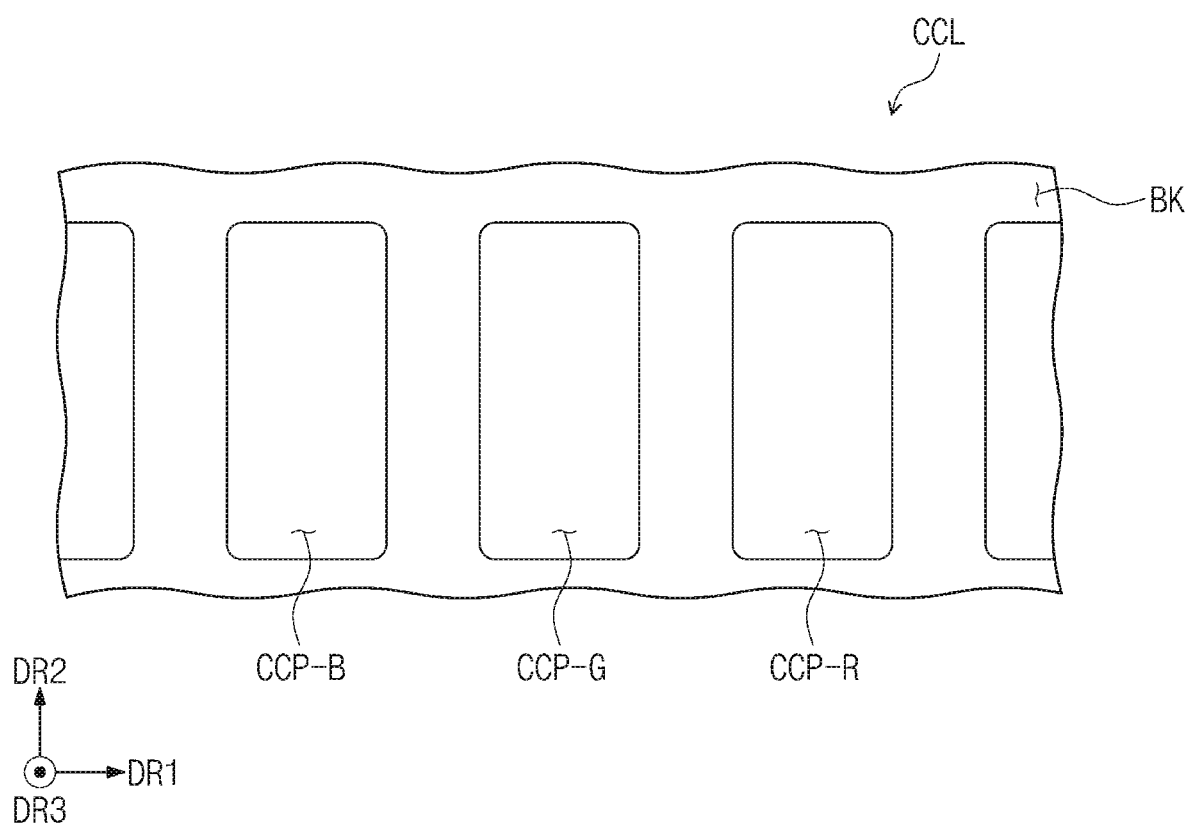
FIG. 4B illustrates a plan view showing a color control layer according to an embodiment.
Figure 5:
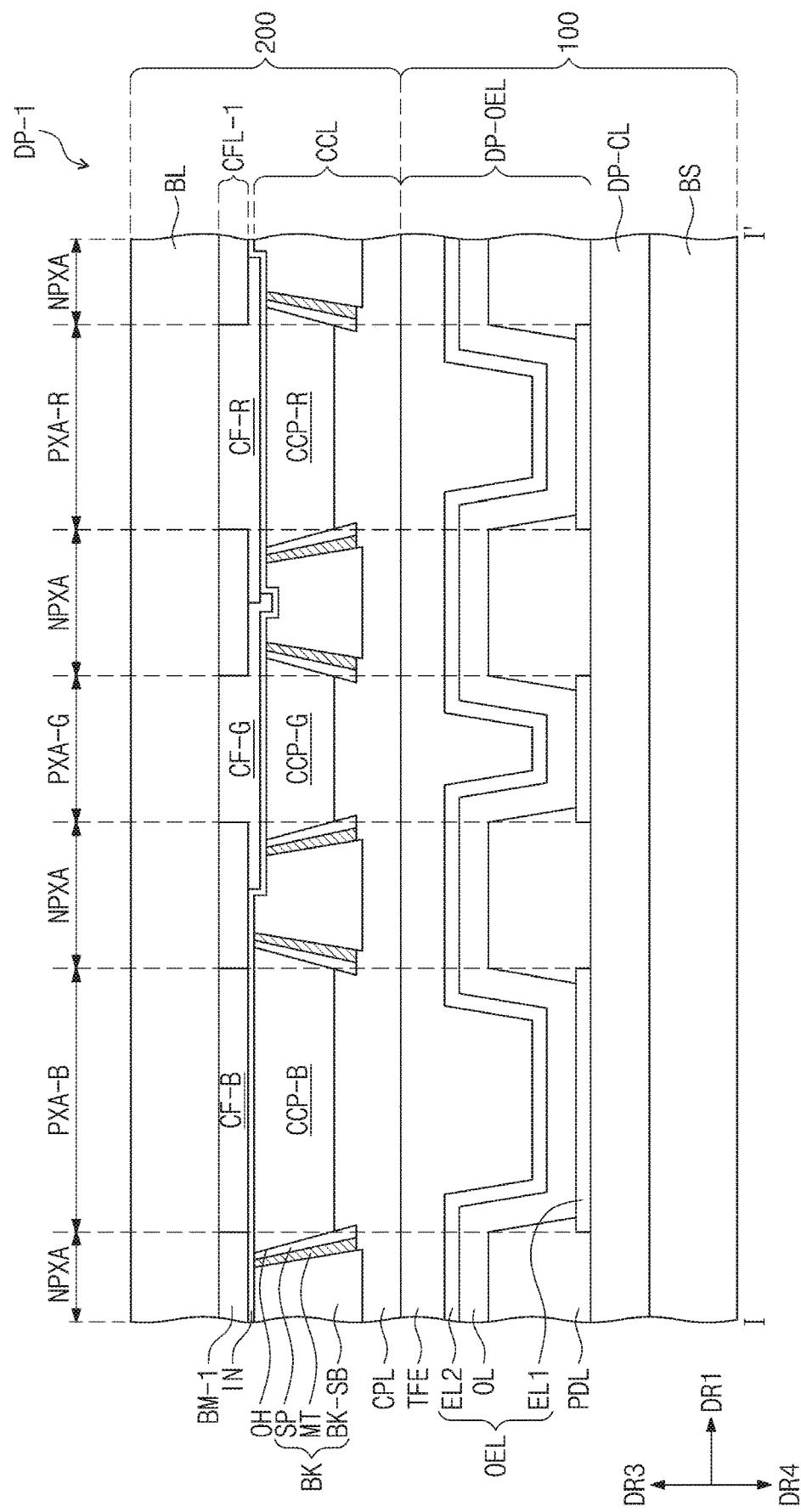
FIG. 5 illustrates a cross-sectional view taken along line I-I' of FIG. 3, showing a display panel according to an embodiment.

FIG. 1A illustrates a perspective view showing the display panel DP according to an embodiment. FIG. 1B illustrates a cross-sectional view showing the display panel DP according to an embodiment. FIG. 2 illustrates a plan view showing the display panel DP according to an embodiment. FIG. 3 illustrates a plan view partially showing the display panel DP according to an embodiment. FIG. 4a illustrates a cross-sectional view taken along line I-I' of FIG. 3, showing a display panel DP according to an embodiment. FIG. 4b illustrates a plan view showing a color control layer CCL according to an embodiment. FIG. 5 illustrates a cross-sectional view taken along line I-I' of FIG. 3, showing a display panel DP-1 according to an embodiment.

Referring to FIGS. 1A, 1B, and 2, the display panel DP may be one of a liquid crystal display panel, an electrophoretic display panel, a microelectromechanical systems (MEMS) display panel, an electrowetting display panel, and an organic light emitting display panel, but the present inventive concepts are not limited thereto.

Although not shown, the display panel DP may further include a chassis or a molding, and may still further include a backlight unit according to a type of the display panel DP.

The display panel DP may include a lower display substrate 100 (referred to hereinafter as a first substrate) and an upper display substrate 200 (referred to hereinafter as a second substrate) that faces and is spaced apart from the first substrate 100. A certain cell gap may be formed between the first substrate 100 and the second substrate 200. The cell gap may be maintained by a sealant SLM that combines the first substrate 100 with the second substrate 200. The present inventive concepts, however, are not limited thereto. In another embodiment, the sealant SLM may be omitted according to a type of the display panel DP. A gray-scale display layer may be disposed between the first substrate 100 and the second substrate 200 for image creation. The gray-scale display layer may include a liquid crystal layer, an organic light emitting layer, or an electrophoretic layer, or the like, according to a type of the display panel DP.

As shown in FIG. 1A, the display panel DP may display an image on a display surface DP-IS. As shown in FIG. 1B, an outer surface 200-OS of the second substrate 200 may be the display surface DP-IS.

The display surface DP-IS is parallel to a plane defined by a first direction DR1 and a second direction DR2. The display surface DP-IS may include a display region DA and a non-display region NDA. A pixel PX may be disposed on the display region DA and the pixel PX may not be disposed on the non-display region NDA. The non-display region NDA is disposed along a border of the display surface DP-IS. The display region DA may be surrounded by the non-display region NDA. In an embodiment of the present inventive concepts, the non-display region NDA may be omitted or may be disposed only on one side of the display region DA.

A third direction DR3 indicates a normal direction to the display surface DP-IS, or a thickness direction of the display panel DP. The third direction DR3 differentiates a front surface (or top surface) and a rear surface (or bottom surface) of each layer or unit which will be discussed below. In this description, the first, second, and third directions DR1, DR2, and DR3 are merely illustrative examples. Herein, first, second, and third directions are defined by the first, second, and third directions DR1, DR2, and DR3, and the same symbols are allocated thereto.

In an embodiment of the present inventive concepts, the display panel DP is illustrated to have a flat display surface DP-IS, but the present inventive concepts are not limited thereto. The display panel DP may include a curved display surface or a three-dimensional display surface. The three-dimensional display surface may include a plurality of display regions oriented in different directions.

FIG. 2 shows a plan view showing a display panel which includes pixels PX11 to PXnm and signal lines GL1 to GLn and DL1 to DLm. The signal lines GL1 to GLn and DL1 to DLm may include a plurality of gate lines GL1 to GLn and a plurality of data lines DL1 to DLm.

Each of the pixels PX11 to PXnm is connected to a corresponding one of the plurality of gate lines GL1 to GLn and to a corresponding one of the plurality of data lines DL1 to DLm. Each of the pixels PX11 to PXnm may include a pixel driver circuit and a display element. In addition to the plurality of gate lines GL1 to GLn and the plurality of data lines DL1 to DLm, the display panel DP may further include various kinds of signal lines.

The pixels PX11 to PXnm are illustrated as being arranged in a matrix shape, but the present inventive concepts are not limited thereto. The pixels PX11 to PXnm may be disposed in a pentile shape. The pixels PX11 to PXnm may be disposed in a diamond shape. A gate driver circuit GDC may be integrated on the display panel DP through an oxide silicon gate driver circuit (OSG) process or an amorphous silicon gate driver circuit (ASG) process.

Referring to FIG. 3, the display panel DP may include a non-light emitting region NPXA and light emitting regions PXA-R, PXA-G, and PXA-B. Each of the light emitting regions PXA-R, PXA-G, and PXA-B may be a zone that emits light generated from a corresponding one of a plurality of light emitting elements (see OEL of FIG. 4a). The light emitting regions PXA-R, PXA-G, and PXA-B may have different areas from each other according to colors of light the light emitting regions emit when viewed on a plane. In this description, the phrase "when viewed on a plane" may mean that when viewed in the third direction DR3 (or, in the thickness direction). The light emitting regions PXA-R, PXA-G, PXA-B may include a plurality of groups according to the color of light emitted from the plurality of light emitting elements OEL. In this description, each of the light emitting regions PXA-R, PXA-G, and PXA-B may correspond to a pixel.

FIG. 3 exemplarily shows that the display panel DP includes three light emitting regions PXA-R, PXA-G, and PXA-B that emits a first light, a second light, and a third light. For example, the display panel DP according to an embodiment may include a first light emitting regions PXA-B, a second light emitting regions PXA-G, and a third light emitting regions PXA-R In an embodiment, the first light emitting region PXA-B may be a region that emits a blue light having a wavelength range of 420 nm to 480 nm. The second light emitting region PXA-G may be a region that emits a green light having a wavelength range of 500 nm to 580 nm. The third light emitting region PXA-R may be a region that emits a red light having a wavelength range of 600 nm to 670 nm.

For the display panel DP according to an embodiment, a plurality of first light emitting regions PXA-B and a plurality of third light emitting regions PXA-R may be arranged alternately along the first direction DR1 to constitute a first group PXG1. A plurality of second light emitting regions PXA-G may be arranged along the first direction DR1 to constitute a second group PXG2.

The first group PXG1 may be disposed spaced apart in the second direction DR2 from the second group PXG2. Each of the first and second groups PXG1 and PXG2 may be provided in plural. The first groups PXG1 and the second groups PXG2 may be arranged alternately with each other along the second direction DR2.

An arrangement of the light emitting regions PXA-R, PXA-G, and PXA-B shown in FIG. 3 may be called a pentile structure. However, on the display panel DP, the arrangement structure of the light emitting regions PXA-R, PXA-G, and PXA-B is not limited to that shown in FIG. 3. For example, in an embodiment, the light emitting regions PXA-R, PXA-G, and PXA-B may have a stripe shape in which the first light emitting region PXA-B, the second light emitting region PXA-G, and the third light emitting region PXA-R are sequentially arranged along the second direction DR2.

Referring to FIG. 4a, the display panel DP may include the first substrate 100 and the second substrate 200 disposed on the first substrate 100.

In an embodiment, the first substrate 100 may include a base substrate BS, a circuit layer DP-CL disposed on the base substrate BS and a display element layer DP-OEL disposed on the base substrate BS. In an embodiment, the base substrate BS, the circuit layer DP-CL, and the display element layer DP-OEL may be sequentially arranged along the third direction DR3.

The base substrate BS may provide a base surface on which the display element layer DP-OEL is disposed. The base substrate BS may include glass, metal, or synthetic resin. The base substrate BS may be rigid or flexible.

In an embodiment, the circuit layer DP-CL may be disposed on the base substrate BS, and may include a plurality of transistors (not shown). The transistors (not shown) may each include a control electrode, an input electrode, and an output electrode. For example, the circuit layer DP-CL may include a switching transistor and a driving transistor that drive a plurality of light emitting elements OLE of the display element layer DP-OEL.

The display element layer DP-OEL may include a pixel defining layer PDL, a plurality of light emitting elements OEL, and a thin-film encapsulation layer TFE. The pixel defining layer PDL may be formed of a polymer resin. For example, the pixel defining layer PDL may be formed of a polyacrylate-based or polyimide-based resin. The pixel defining layer PDL may be formed of a polymer resin and an inorganic material. The pixel defining layer PDL may be formed of a light-absorbing material, a black pigment, or a black dye. The pixel defining layer PDL may be formed of an inorganic material. For example, the pixel defining layer PDL may be formed of silicon nitride (SiNx), silicon oxide (SiOx), or silicon oxynitride (SiOxNy). The pixel defining layer PDL may define the light emitting regions PXA-B, PXA-G, and PXA-R. The pixel defining layer PDL may differentiate the light emitting regions PXA-B, PXA-G, and PXA-R from the non-light emitting regions NPXA.

The pixel defining layer PDL may overlap a wall BK in a color control layer CCL. For example, each of a plurality of pixel defining layers PDL may overlap each of a plurality of walls BK, respectively.

The plurality of light emitting elements OEL may each include a first electrode EL1, a second electrode EL2 that faces the first electrode EL1, and an organic layer OL disposed between the first electrode EL1 and the second electrode EL2. The organic layer OL may include a hole transport layer, a light emitting layer, and an electron transport layer. The hole transport layer may include a hole injection layer disposed adjacent to the first electrode EL1 and also include a hole transport layer disposed between the hole injection layer and the light emitting layer, and the electron transport layer may include an electron injection layer disposed adjacent to the second electrode EL2 and also include an electron transport layer disposed between the light emitting layer and the electron injection layer.

The thin-film encapsulation layer TFE may be disposed on the plurality of light emitting elements OEL, and may be disposed on the second electrode EL2. The thin-film encapsulation layer TFE may be directly disposed on the second electrode EL2. The thin-film encapsulation layer TFE may be a single layer or multi layers in which a plurality of layer are vertically stacked. The configuration of the first substrate 100, however, is not limited thereto. In another embodiment, the first substrate 100 may further include an input sensor (not shown) disposed on the thin-film encapsulation layer TFE. The input sensor (not shown) may be an input sensing layer or an input sensing circuit.

In an embodiment, the second substrate 200 may be disposed on the first substrate 100. The second substrate 200 may include a color control layer CCL, an inorganic layer IN, a color filter layer CFL, and a base layer BL. Hereinafter, an example where the second substrate 200 has a structure in which the color filter layer CFL, the inorganic layer IN, and the color control layer CCL are sequentially stacked on the base layer BL will be described. The present inventive concepts, however, are not limited thereto.

The base layer BL may be a substrate that provides a base surface on which the color filter layer CFL, the inorganic layer IN, and the color control layer CCL are disposed. The base layer BL may be a glass substrate, a metal substrate, or a plastic substrate. However, the present inventive concepts are not limited thereto, and the base layer BL may include an inorganic material, an organic material, or a composite material.

The color filter layer CFL may be disposed between the base layer BL and the inorganic layer IN. In an embodiment, the color filter layer CFL may include a light shielding layer BM and a plurality of color filters CF-B, CF-G, and CF-R.

The light shielding layer BM may be disposed on the base layer BL. A plurality of light shielding layers BM may be disposed spaced apart from each other while exposing a portion of the base layer BL. The plurality of color filters CF-B, CF-G, and CF-R may be disposed between the light shielding layers BM.

The plurality of color filters CF-B, CF-G, and CF-R may include a first color filter CF-B, a second color filter CF-G, and a third color filter CF-R. The first color filter CF-B may transmit a first color light. The second color filter CF-G may transmit a second light different from the first color light. The third color filter CF-R may transmit a third color light different from both the first color light and the second color light.

The first color light may be light emitted from a plurality of light emitting elements OEL. For example, the first color light may be a blue light. The first color filter CF-B may be a blue color filter. The second color filter CF-G may be a green color filter and the third color filter CF-R may be a red color filter. The present inventive concepts, however, are not limited thereto.

Each of the color filters CF-B, CF-G, and CF-R may include a polymeric photosensitive resin and either a pigment or a dye. The first color filter CF-B may include a blue pigment or dye, the second color filter CF-G may include a green pigment or dye, and the third color filter CF-R may include a red pigment or dye.

However, the present inventive concepts are not limited thereto, and the first color filter CF-B may not include a pigment or a dye. The first color filter CF-B may include a polymeric photosensitive resin, but not include a pigment or dye. The first color filter CF-B may be transparent. The first color filter CF-B may be formed of a transparent photosensitive resin.

In an embodiment, the light shielding layer BM may be a black matrix. The light shielding layer BM may be formed of an inorganic or organic light shielding material including a black pigment or dye.

The light shielding layer BM may prevent light leakage and may define a boundary between adjacent ones of the color filters CF-B, CF-G, and CF-R.

The light shielding layer BM may be provided in plural, and each of the plurality of light shielding layers BM may overlap each of the plurality of walls BK, respectively.

The color filter layer CFL may further include a low-refractive layer (not shown). The low-refractive layer (not shown) may be disposed between the color filter layer CFL and the color control layer CCL. The low-refractive layer (not shown) may have a refractive index of 1.1 to 1.5. The refractive index of the low-refractive layer (not shown) may be controlled by proportions of hollow inorganic particles and/or voids.

The color filter layer CFL may further include a buffer layer BFL. The buffer layer BFL may be a protective layer that protects the low-refractive layer (not shown) or the color filter layer CF. The buffer layer BFL may be an inorganic layer that includes at least one of silicon nitride, silicon oxide, and silicon oxynitride. The buffer layer BFL may be formed of a single layer or a plurality of layers.

The constituent of the color filter layer CFL, however, is not limited thereto. Referring to FIG. 5, no buffer layer BFL may be included in a color filter layer CFL-1 according to an embodiment. In addition, a light shielding layer BM-1 according to an embodiment may be formed by the same process used to form the first color filter CF-B. For example, the light shielding layer BM-1 may be formed of an inorganic light shielding material or an organic light shielding material including a blue pigment or a blue dye. As shown in FIG. 5, the light shielding layer BM-1 may be formed at the same time with using the same material as the first color filter CF-B.

The inorganic layer IN may be disposed on the color filter layer CFL or CFL-1. The inorganic layer IN may include at least one of silicon oxide, silicon nitride, indium tin oxide (referred to hereinafter as ITO), and indium zinc oxide (referred to hereinafter as IZO). For example, the inorganic layer IN may be silicon oxide (SiOx). When the inorganic layer IN includes silicon oxide (SiOx), the inorganic layer IN may have increased durability and a reduced refractive index in comparison with a case where the inorganic layer IN includes a material other than silicon oxide (SiOx). The present inventive concepts, however, are not limited thereto. For example, in another embodiment, the inorganic layer IN may include IZO.

The color control layer CCL may be disposed on the inorganic layer IN. The color control layer CCL may include a wall BK and a plurality of color control parts CCP-B, CCP-G, and CCP-R. Referring FIG. 4b, the wall BK may surround the plurality of color control parts CCP-B, CCP-G, and CCP-R in a plan view. The color control layer CCL may include a plurality of walls BK in a cross-sectional view. The plurality of walls BK may be disposed spaced apart from each other, and each of the plurality of color control parts CCP-B, CCP-G, and CCP-R may be disposed between adjacent ones of the plurality of walls BK.

For example, the plurality of walls BK may define openings OH that partially expose the inorganic layer IN. The color control parts CCP-B, CCP-G, and CCP-R may be disposed in the openings OH. For example, the color control parts CCP-B, CCP-G, and CCP-R may fill the openings OH using an inkjet process.

In an embodiment, the plurality of color control parts CCP-B, CCP-G, and CCP-R may include a first color control part CCP-B, a second color control part CCP-G, and a third color control part CCP-R. The first color control part CCP-B may transmit and scatter a first light provided from at least one light emitting element OEL. The second color control part CCP-G and the third color control part CCP-R may alter a wavelength of the first light provided from a plurality of light emitting elements OEL and scatter the first light provided from a plurality of light emitting elements OEL.

The first color control part CCP-B may include a base resin and scattering particles. The scattering particles may be uniformly distributed in the base resin. The first color control part CCP-B may include no quantum-dot, and may thus transmit a blue light emitted from a plurality of light emitting elements OEL. The scattering particles may be $TiO_2$ or silica-based nano-particles. The present inventive concepts, however, are not limited thereto. The scattering particles may scatter light emitted from the plurality of light emitting elements OEL. Therefore, the display panel DP may increase in viewing angle. The previous descriptions regarding the scattering particles included in the first color control part CCP-B may also be applicable to scattering particles included in the second and third color control parts CCP-G and CCP-R, and accordingly, detailed description thereof will be omitted below.

The second color control part CCP-G may include first quantum-dots, a base resin, and scattering particles. The first quantum-dots and the scattering particles may be uniformly distributed in the base resin. The first quantum-dot may absorb a blue light emitted from the plurality of light emitting elements OEL and emit a green light.

The third color control part CCP-R may include a base resin, second quantum-dots, and scattering particles. The second quantum-dots and the scattering particles may be uniformly distributed in the base resin. The second quantum-dot may absorb a blue light emitted from the plurality of light emitting elements OEL and emit a red light. The present inventive concepts, however, are not limited thereto.

The light emitting regions PXA-B, PXA-G, and PXA-R of the display panel DP may overlap the plurality of color control parts CCP-B, CCP-G, and CCP-R, respectively. The light emitting regions PXA-B, PXA-G, and PXA-R may have their areas different from each other according to colors emitted from the plurality of color control parts CCP-B, CCP-G, and CCP-R. For example, the light emitting region PXA-B, or a blue light emitting region, that corresponds to the first color control part CCP-B through which a blue light passes may have the largest area, and the light emitting region PXA-G, or a green light emitting region, that corresponds to the second color control part CCP-G from which a green light is generated and emitted may have the smallest area. However, the present inventive concepts are not limited thereto, and the light emitting regions PXA-B, PXA-G, and PXA-R may emit light whose colors are different from a blue light, a green light, and a red light. In other embodiments, the light emitting regions PXA-R, PXA-G, and PXA-B may have the same area, or may have areas different from that shown above.

In an embodiment, the color control layer CCL may further include a capping layer CPL. The capping layer CPL may prevent moisture and/or oxygen (called moisture/oxygen hereinafter) from being permeated into the color control layer CCL. For example, the capping layer CPL may prevent the plurality of color control parts CCP-B, CCP-G, and CCP-R from being exposed to moisture/oxygen.

The capping layer CPL may be formed of an inorganic material. For example, the capping layer CPL may be formed either of a material including at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or of a metal film whose light transmittance is secured. The capping layer CPL may further include an organic layer. The capping layer CPL may be formed of a single layer or a plurality of layers.

FIGS. 6 to 15 illustrate cross-sectional views showing walls BK, BK-1, BK-2, BK-4, BK-5, BK-6, BK-7, BK-8, and BK-9 according to some embodiments. In detail, FIGS. 6 to 15 show cross-sections of the display panel DP taken along the first direction DR1 and/or a fourth direction DR4.

Hereinafter, for convenience of description, an upward direction refers to a direction indicated by the fourth direction DR4, and a downward direction refers to a direction indicated by the third direction DR3.

Figure 6:
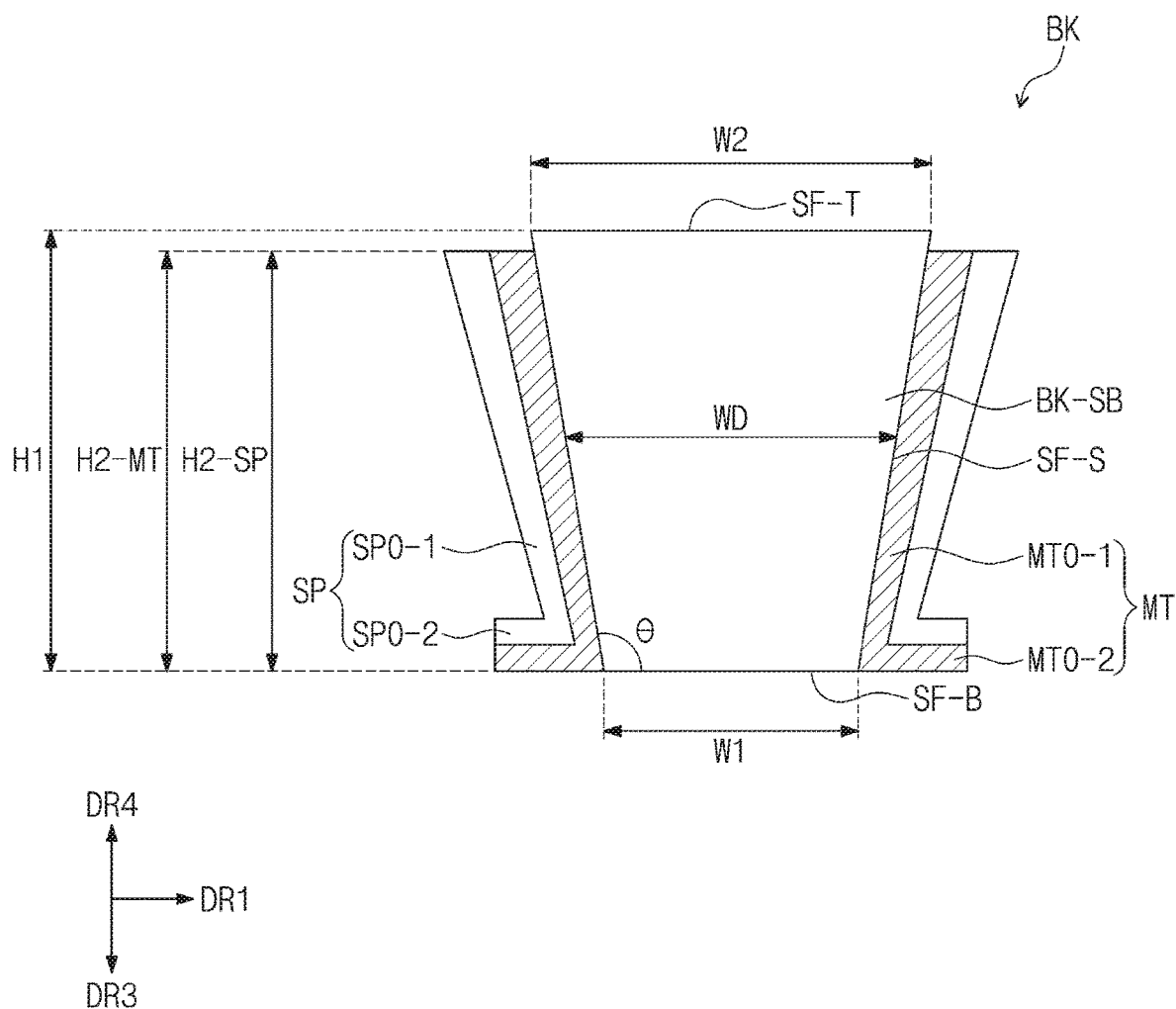
FIGS. 6, 7, 8, 9, 10, 11, 12, 13, 14 and 15 illustrate cross-sectional views showing a wall according to an embodiment.

Referring to FIG. 6, in an embodiment, the wall BK may include a wall base BK-SB and at least one functional layer. For example, the functional layer may be a reflective layer MT and/or a spacer layer SP. The reflective layer MT and the spacer layer SP surround at least a portion of the wall base BK-SB.

The wall base BK-SB may have a first surface SF-B adjacent to the base layer (see BL of FIG. 4a or 5), a second surface SF-T that faces the first surface SF-B and is adjacent to the first substrate (see 100 of FIG. 4a), and a third surface SF-S that connects the first surface SF-B to the second surface SF-T. For example, the second surface SF-T may be a top surface of the wall base BK-SB, the first surface SF-B may be a bottom surface of the wall base BK-SB, and the third surface SF-S may be a side surface of the wall base BK-SB.

In an embodiment, the wall base BK-SB may have a width WD that increases as approaching the second surface SF-T from the first surface SF-B. For example, a maximum width W1 of the first surface SF-B may be less than a maximum width W2 of the second surface SF-T. In this description, the width WD of the wall base BK-SB may refer to a cross-sectional length of the wall base BK-SB measured in the first direction DR1.

In an embodiment, in a cross-sectional view, the wall base BK-SB has an obtuse angle θ between the third surface SF-S and the first surface SF-B. Hereinafter, a shape of the wall base BK-SB having the width WD and the angle θ discussed above will be referred to as a reverse trapezoidal shape. The sidewall of the wall base is formed to have a reversely tapered shape along a direction perpendicular to the lower display substrate. The previous descriptions regarding the width WD and the angle θ of the wall base BK-SB shown in FIG. 6 are also identically applicable to the embodiments of FIGS. 7 to 15, and accordingly, repetitive descriptions thereof will be omitted.

In an embodiment, the wall base BK-SB may include a polymer resin and a repellent additive. For example, a concentration of the repellent additive may be greater in an upper portion of the wall base BK-SB than in a lower portion of the wall base BK-SB. Therefore, liquid repellency may be given to the second surface SF-T or the top surface of the wall base BK-SB. In other words, the second surface SF-T or the top surface of the wall base BK-SB may have hydrophobic characteristic.

The wall base BK-SB may have a low surface energy at a portion having a high concentration of the repellent additive. The wall base BK-SB may have a high surface energy at a portion having a low concentration of the repellent additive. Therefore, in an embodiment, the wall BK may have a surface energy that is lower at the second surface SF-T than at the third surface SF-S. For example, the surface energy at the second surface SF-T of the wall base BK-SB may be equal to or less than 20 dyne/cm, and the surface energy at the third surface SF-S of the wall base BK-SB may be equal to or greater than 30 dyne/cm.

Therefore, the wall base BK-SB according to an embodiment may have liquid repellency at the second surface SF-T or the top surface thereof, and may have no liquid repellency at the third surface SF-S or the side surface thereof. Because the second surface SF-T has hydrophobic characteristic, during the formation of the color control layer CCL, a composition of a plurality of color control parts CCP-B, CCP-G, and CCP-R may not formed on the second surface SF-T, but may flow toward the third surface SF-S and easily fill the opening OH between a plurality of walls BK using an inkjet process. The composition of a plurality of color control parts CCP-B, CCP-G, and CCP-R may include a base resin, scattering particles, and quantum-dots discussed above.

Referring still to FIG. 6, the reflective layer MT and the spacer layer SP may surround at least a portion of the third surface SF-S of the wall base BK-SB. For example, the reflective layer MT may be in contact with the third surface SF-S, and the spacer layer SP may be in contact with the reflective layer MT.

In an embodiment, the reflective layer MT may include a first sub-reflective layer MT0-1 and a second sub-reflective layer MT0-2. For example, the first sub-reflective layer MT0-1 may surround the third surface SF-S or the side surface of the wall base BK-SB. The first sub-reflective layer MT0-1 may be, for example, in contact with the third surface SF-S or the side surface of the wall base BK-SB. The second sub-reflective layer MT0-2 may extend from the first sub-reflective layer MT0-1 in a direction parallel to the first surface SF-B and may be disposed adjacent to the first surface SF-B.

The reflective layer MT may reflect light. For example, light emitted from a plurality of color control parts CCP-B, CCP-G, and CCP-R may be reflected from the reflective layer MT and may travel outwardly through the base layer BL. The reflected light may pass through the base layer BL and may be recognized by users, and may determine brightness of the display device DD. For example, the larger quantity of light reflected outwardly through the base layer BL, the higher brightness of the display device DD.

The reflective layer MT may include metal, for example, aluminum (Al). The present inventive concepts, however, are not limited thereto. When the reflective layer MT includes aluminum, the reflective layer MT may have reflectance equal to or greater than 90%. Aluminum included in the reflective layer MT may contact oxygen and may then be oxidized to form aluminum oxide ($AlO_3$). When aluminum oxide ($AlO_3$) is formed, the reflectance of the reflective layer MT may be reduced to 70% to 80%. To prevent oxidation of the reflective layer MT, the spacer layer SP may be disposed to cover the reflective layer MT.

In an embodiment, the spacer layer SP may surround the reflective layer MT. For example, the reflective layer MT may be disposed between the spacer layer SP and the third surface SF-S of the wall base BK-SB. The spacer layer SP may prevent the deterioration in reflectance of the reflective layer MT, while surrounding the reflective layer MT.

The spacer layer SP may include a first sub-spacer layer SP0-1 and a second sub-spacer layer SP0-2.

The first sub-spacer layer SP0-1 may be disposed to cover the first sub-reflective layer MT0-1. For example, the first sub-spacer layer SP0-1 may be in contact with the first sub-reflective layer MT0-1. The second sub-spacer layer SP0-2 may extend from the first sub-spacer layer SP0-1 in a direction parallel to the base layer BL, and may be disposed to cover the second sub-reflective layer MT0-2.

The spacer layer SP may include an inorganic material. For example, the spacer layer SP may include at least one of silicon oxide, silicon nitride, silicon oxynitride, ITO, and IZO. For example, the inorganic material may be silicon oxide ($SiOx$). The present inventive concepts, however, are not limited thereto. When the spacer layer SP includes silicon oxide ($SiOx$), the spacer layer SP may have transmittance equal to or greater than 95%. In addition, silicon oxide ($SiOx$) may have resistance to etching, and thus may remain without being damaged in an etching process.

In an embodiment, the functional layer may refer to the reflective layer MT and the spacer layer SP.

The spacer layer SP including silicon oxide ($SiOx$) may have high transmittance and a low reflective index. For example, light emitted from a plurality of color control parts CCP-B, CCP-G, and CCP-R may pass through the spacer layer SP and may reach the reflective layer MT. The light may be reflected from the reflective layer MT and then may travel outwardly through the base layer BL. In addition, because the wall BK has a reverse trapezoidal shape, it may be possible to increase a light output ratio, or the ratio of light outwardly reflected through the base layer BL to light emitted from a plurality of color control parts CCP-B, CCP-G, and CCP-R. Therefore, the display panel DP may increase in luminous efficiency and brightness.

In the wall BK according to an embodiment, the wall base BK-SB may have a first height H1. The first height H1 may be a value measured from the first surface SF-B to the second surface SF-T in a direction perpendicular to the first surface SF-B. For example, the first height H1 may range from 15 μm to 20 μm. The present inventive concepts, however, are not limited thereto.

In an embodiment, the reflective layer MT may have a second height H2-MT. The second height H2-MT may be a height of the reflective layer MT measured in the fourth direction DR4 from the first surface SF-B. The second height H2-MT may be less than the first height H1.

In an embodiment, the spacer layer SP may have a third height H2-SP. The third height H2-SP may be a height of the spacer layer SP measured in the fourth direction DR4 from the first surface SF-B. The third height H3-SP may be less than the first height H1.

FIG. 6 shows that the second height H2-MT and the third height H2-SP are the same, but the second height H2-MT and the third height H2-SP are not limited to that shown and may be changed depending on processes.

Figure 7:
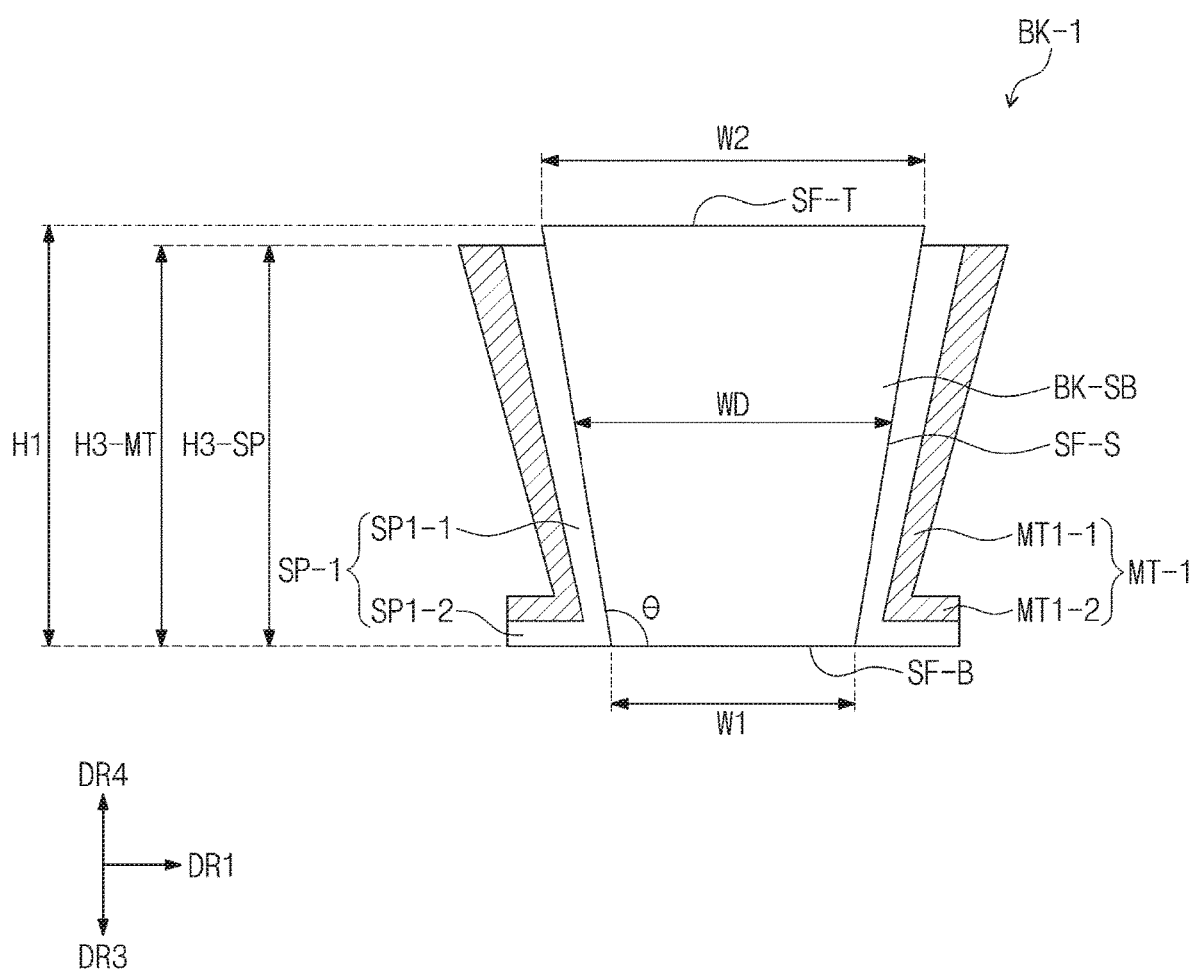

Referring to FIG. 7, the wall BK-1 according to an embodiment may include a reflective layer MT-1, a spacer layer SP-1, and a wall base BK-SB. To be specific, the spacer layer SP-1 may include a first sub-spacer layer SP1-1 and a second sub-spacer layer SP1-2. For example, the first sub-spacer layer SP1-1 may surround the third surface SF-S or the side surface of the wall base BK-SB. The second sub-spacer layer SP1-2 may extend from the first sub-spacer layer SP1-1 in a direction parallel to the first surface SF-B, and may be disposed in contact with the first surface SF-B.

To be specific, the reflective layer MT-1 may surround the spacer layer SP-1. For example, the spacer layer SP-1 may be disposed between the reflective layer MT-1 and the third surface SF-S of the wall base BK-SB. The reflective layer MT-1 may include a first sub-reflective layer MT1-1 and a second sub-reflective layer MT1-2.

The first sub-reflective layer MT1-1 may be disposed to cover the first sub-spacer layer SP1-1. The second sub-reflective layer MT1-2 may extend from the first sub-reflective layer MT1-1 in a direction parallel to the first surface SF-B, and may be disposed to cover the first sub-spacer layer SP1-2.

The previous description regarding to the second height H2-MT of FIG. 6 may be identically applicable to a second height H3-MT.

The previous description regarding to the third height H2-SP of FIG. 6 may be identically applicable to a third height H3-SP.

FIG. 7 shows that the second height H3-MT and the third height H3-SP are the same, but the second height H3-MT and the third height H3-SP are not limited to that shown and may be changed depending on processes. The explanation discussed above in FIG. 6 may be identically applicable to other configurations.

Figure 8:
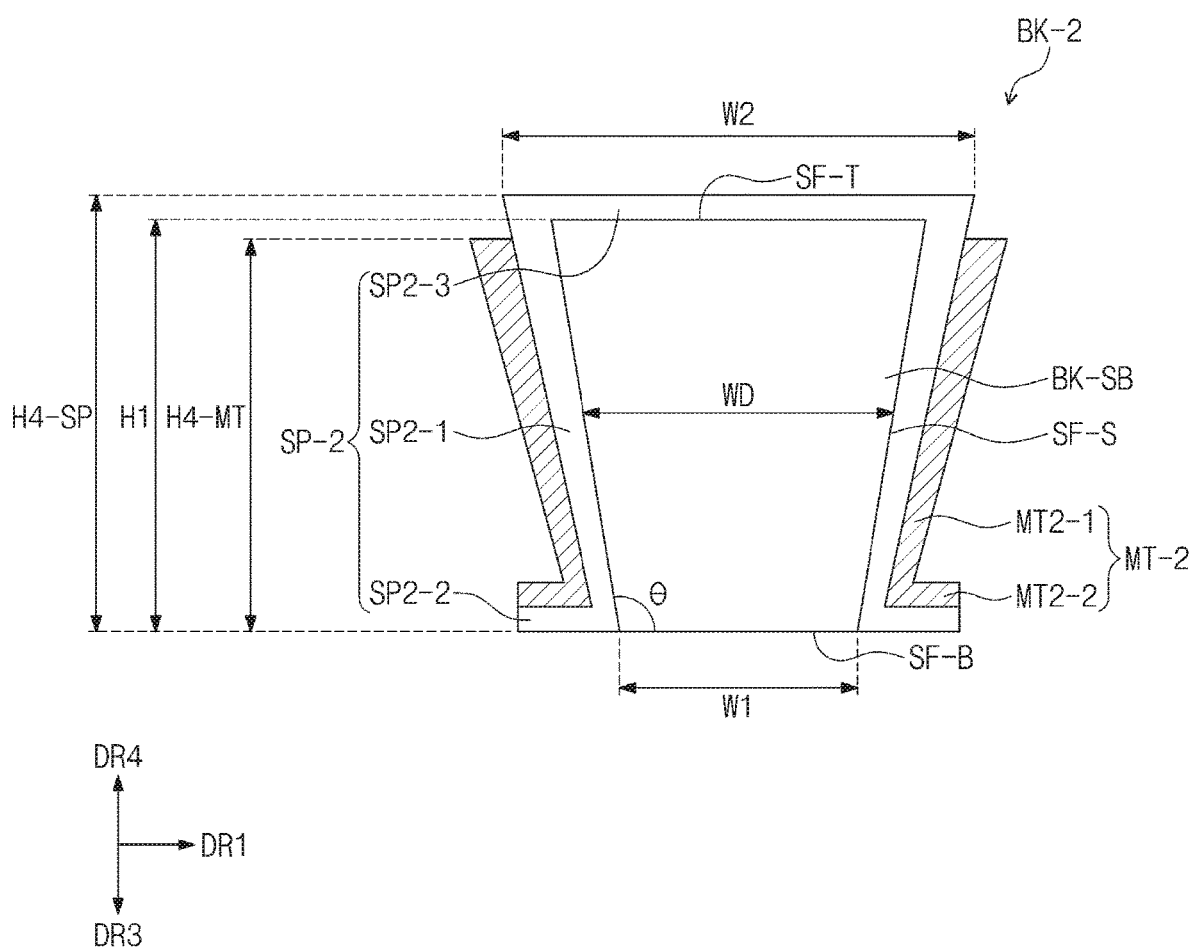

Referring to FIG. 8, the wall BK-2 may be configured such that a spacer layer SP-2 may be disposed between a reflective layer MT-2 and the third surface SF-S. The spacer layer SP-2 may further include a third sub-spacer layer SP2-3. The third sub-spacer layer SP2-3 may cover the second surface SF-T or the top surface of the wall base BK-SB.

A second height H4-MT may be a length measured in the fourth direction DR4 from a plane parallel to the first surface SF-B to the farthest portion of the reflective layer MT-2. The second height H4-MT may be less than the first height H1.

A third height H4-SP may be a length measured in the fourth direction DR4 from a plane parallel to the first surface SF-B to the farthest portion of the spacer layer SP-2. The third height H4-SP may be greater than the first height H1. The explanation discussed above in FIG. 6 may be identically applicable to other configurations.

Figure 9:
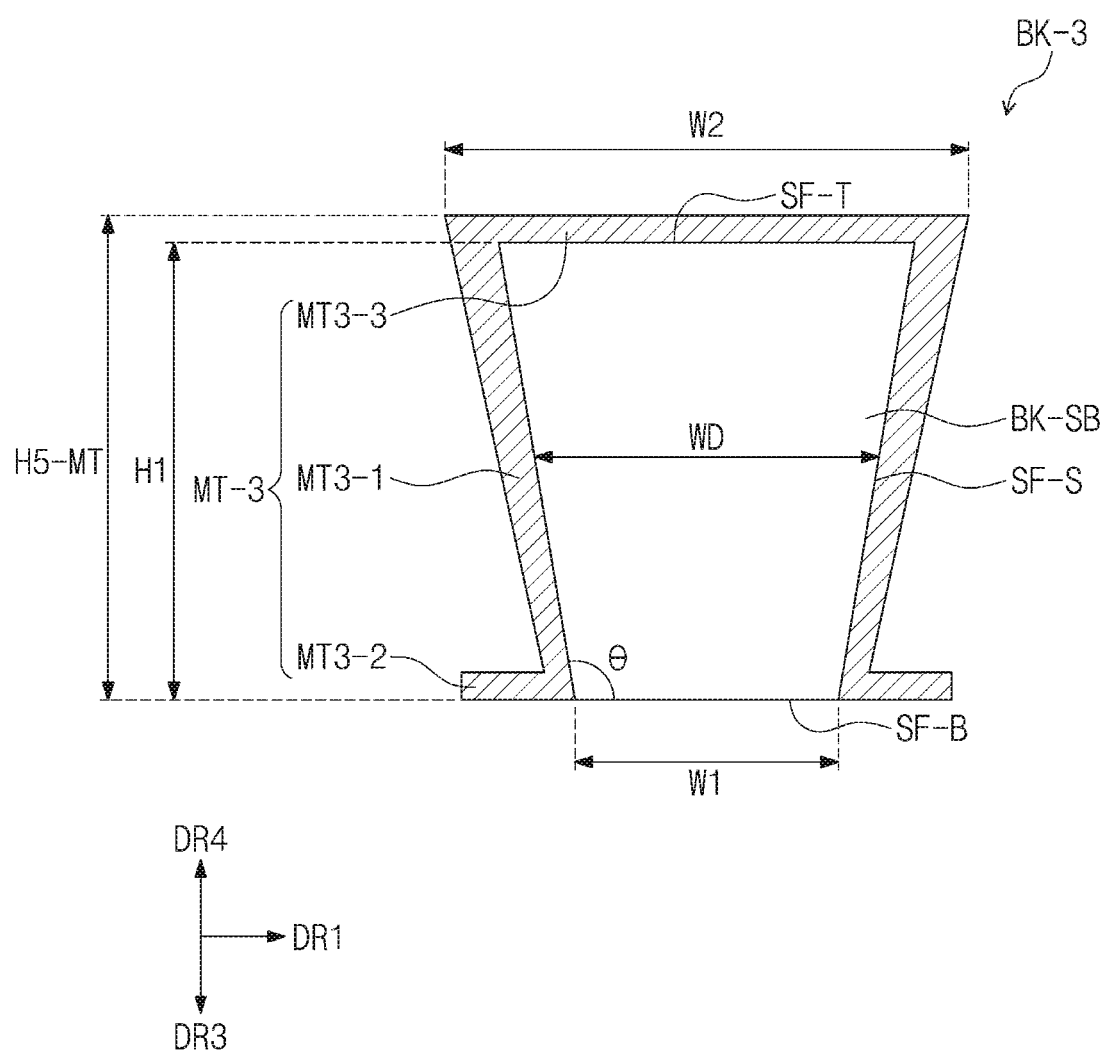

Referring to FIG. 9, the wall BK-3 according to an embodiment may include one functional layer. For example, a reflective layer MT-3 may be included in the wall BK-3 according to an embodiment. A reflective layer MT-3 may be disposed adjacent to the third surface SF-S of the wall base BK-SB. The reflective layer MT-3 may further include a third sub-reflective layer MT3-3. The third sub-reflective layer MT3-3 may cover the second surface SF-T or the top surface of the wall base BK-SB.

A second height H5-MT may be a length measured in the fourth direction DR4 from a plane parallel to the first surface SF-B to the farthest portion of the reflective layer MT-3. The second height H5-MT may be greater than the first height H1. The explanation discussed above in FIG. 6 may be identically applicable to other configurations.

Figure 10:
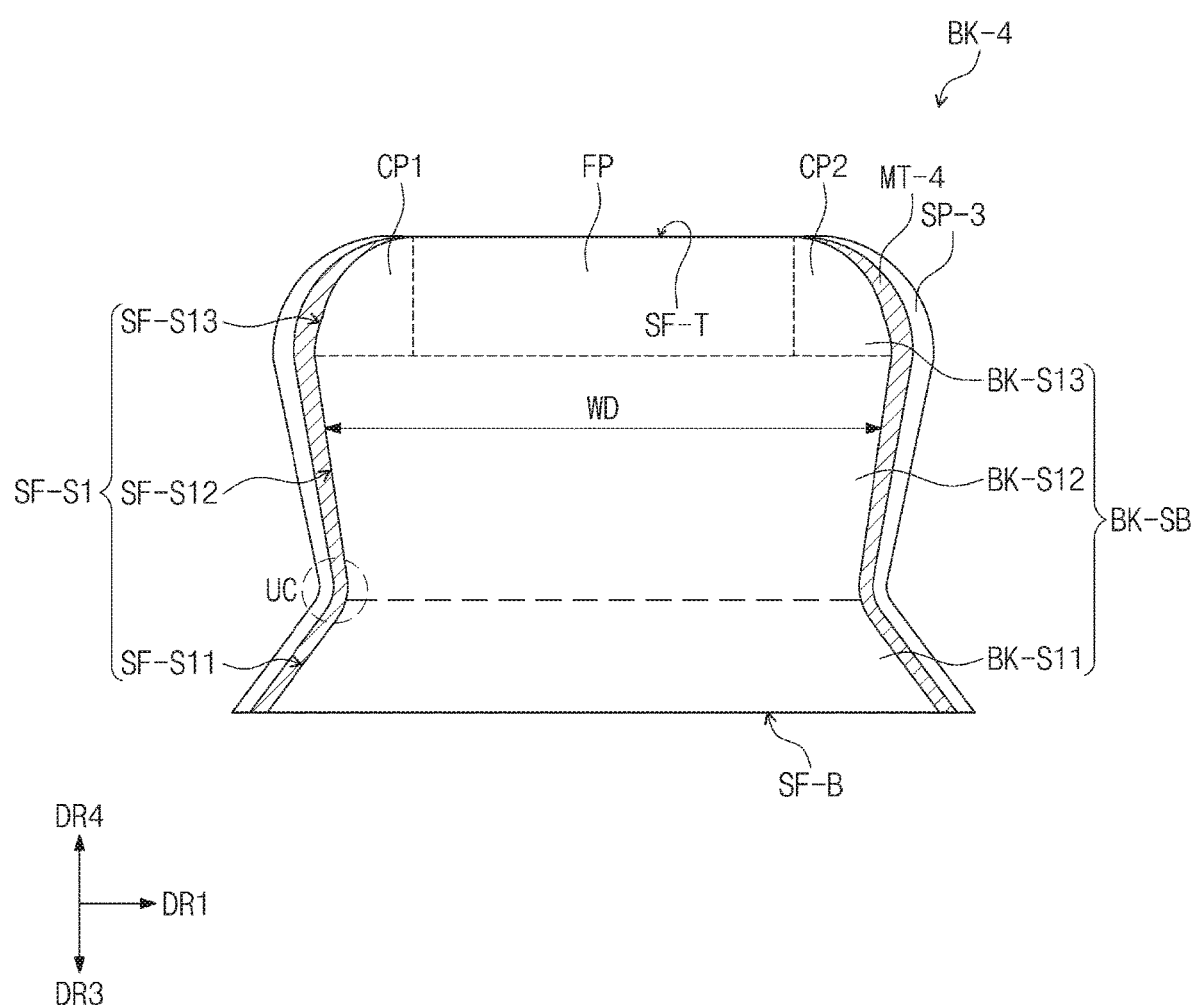

Referring to FIG. 10, the wall BK-4 according to an embodiment may include a wall base BK-SB, a reflective layer MT-4, a spacer layer SP-3. The reflective layer MT-4 may surround the wall base BK-SB. The spacer layer SP-3 may surround the reflective layer MT-4. In addition, the wall base BK-SB of the wall BK-4 according to an embodiment may include a first sub-wall base BK-S11, a second sub-wall base BK-S12, and a third sub-wall base BK-S13. For example, the first sub-wall base BK-S11 may have a width WD that decreases in a direction from a first surface SF-B toward a second surface SF-T that faces the first surface SF-B. In this description, the width WD may indicate a length in the first direction DR1 on a cross-sectional view of the wall base BK-SB.

The second sub-wall base BK-S12 may have a width that increases in a direction from the first sub-wall base BK-S11 toward the second surface SF-T. A concave section UC may be formed at a portion where the first sub-wall base BK-S11 is connected to the second sub-wall base BK-S12.

The third sub-wall base BK-S13 may have a width that decreases in a direction from the second sub-wall base BK-S12 toward the second surface SF-T. The third sub-wall base BK-S13 may have a curved shape at a top edge portion thereof. When viewed in cross-section perpendicular to the first surface SF-B, the third sub-wall base BK-S13 may include a flat part FP and curved parts CP1 and CP2. For example, the flat part FP may have a flat top surface. The curved parts CP1 and CP2 may be disposed on opposite sides of the flat part FP. The curved parts CP1 and CP2 may have curve-shaped portions whose widths decrease in a direction from the second sub-wall base BK-S12 toward the second surface SF-T. For example, a first curved part CP1 may be disposed on one side of the flat part FP. A second curved part CP2 may be symmetric to the first curved part CP1 about the flat part FP, and may be disposed on the other side of the flat part FP.

In an embodiment, the reflective layer MT-4 and the spacer layer SP-3 may surround the wall base BK-SB. Because the wall base BK-SB includes the curved parts CP1 and CP2, the reflective layer MT-4 and the spacer layer SP-3 may have their curved surfaces.

Figure 11:
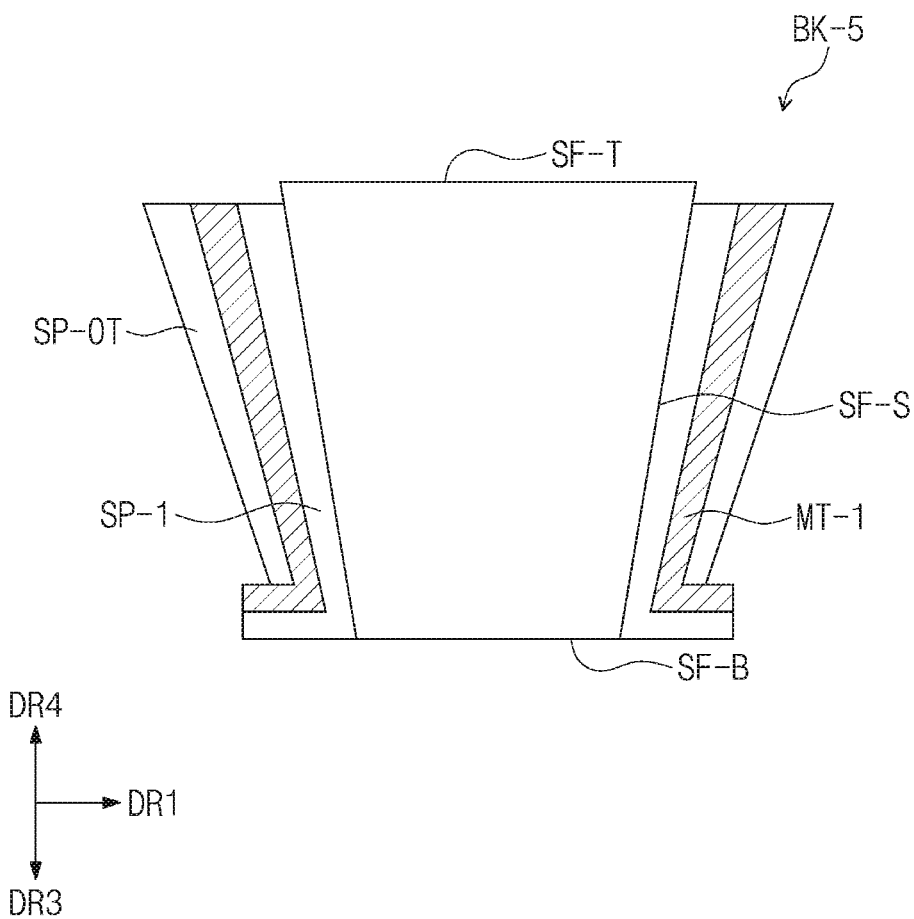

Referring to FIG. 11, the wall BK-5 according to an embodiment may include three functional layers. For example, the wall BK-5 may further include an outer spacer layer SP-OT in addition to the spacer layer SP-1 and the reflective layer MT-1 includes in the wall BK-1 of FIG. 7. The outer spacer layer SP-OT may surround and prevent the reflective layer MT-1 from being oxidized.

In an embodiment, each of the spacer layer SP-1 and the outer spacer layer SP-OT may include an inorganic material. To be specific, the spacer layer SP-1 and the outer spacer layer SP-OT may independently include at least one of silicon oxide, silicon nitride, silicon oxynitride, ITO, and IZO. For example, the spacer layer SP-1 may include silicon oxide (SiOx). The outer spacer layer SP-OT may include IZO. The explanation discussed above in FIG. 7 may be identically applicable to other configurations.

Figure 12:
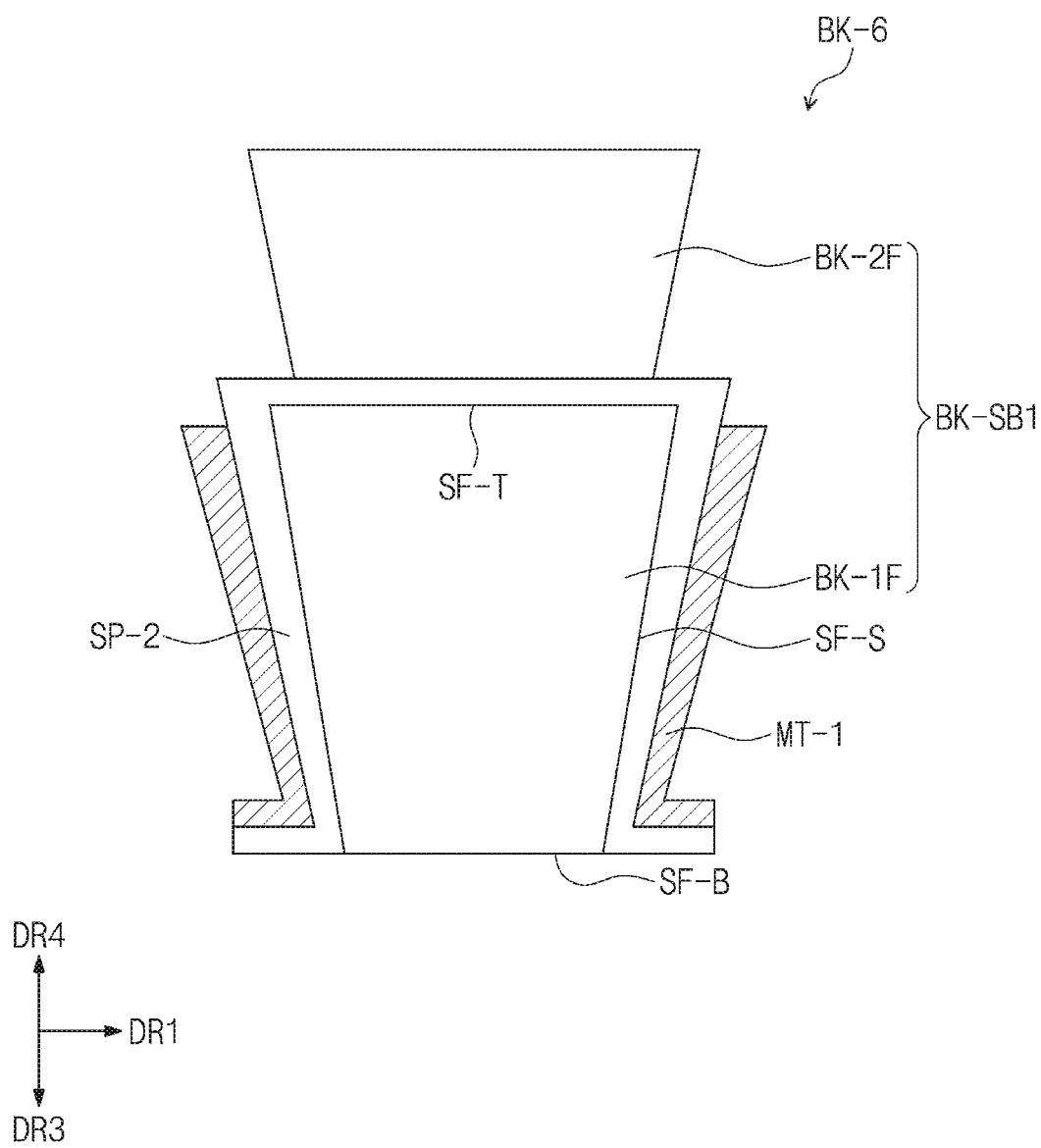
Figure 13:
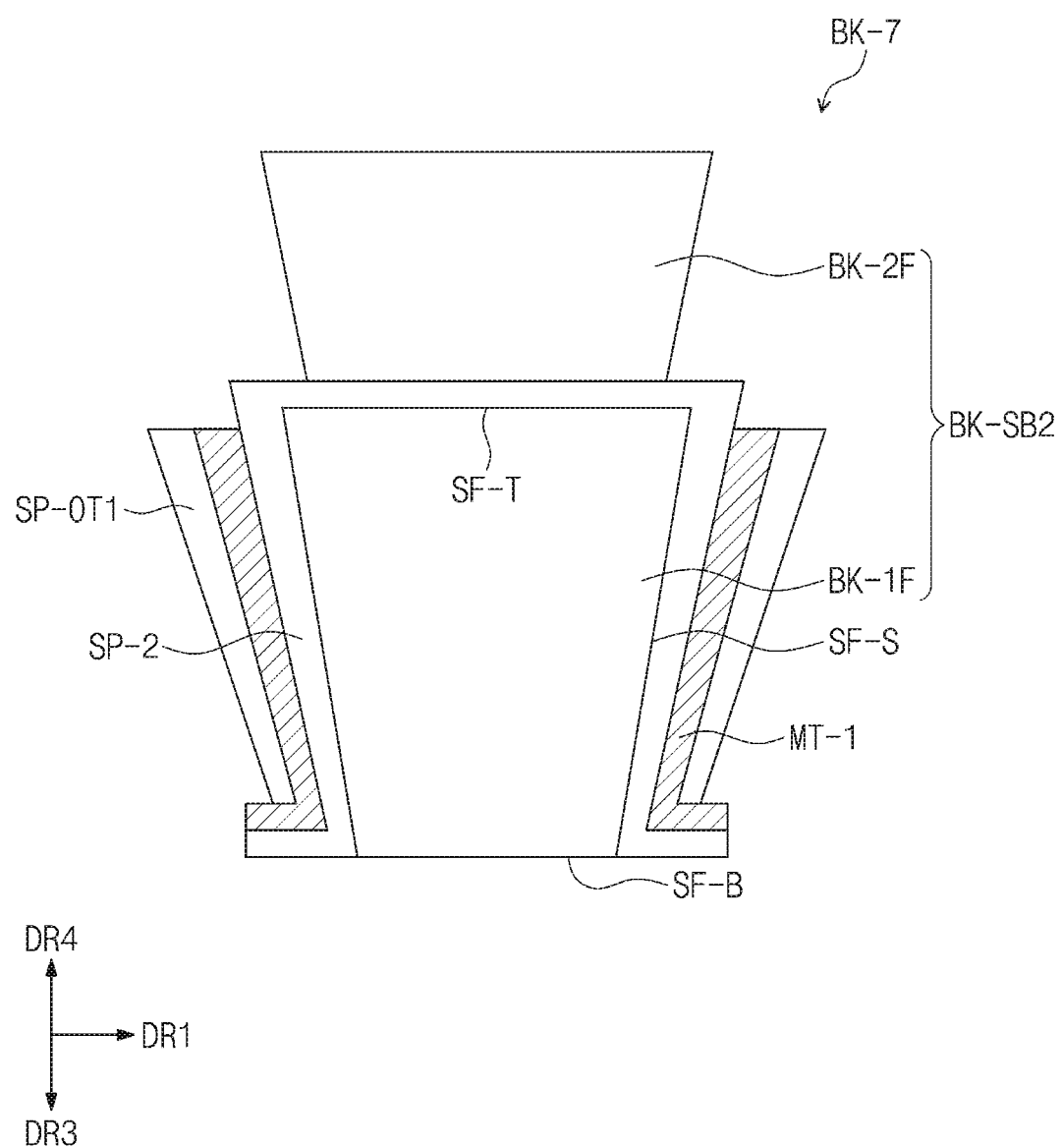

Referring to FIGS. 12 and 13, the walls BK-6 and BK-7 according to embodiments may correspondingly include wall bases BK-SB1 and BK-SB2 each of which has a multiple layer. For example, each of the wall bases BK-SB1 and BK-SB2 may include a first-floor wall BK-1F and a second-floor wall BK-2F. In an embodiment, each of the first-floor wall BK-1F and the second-floor wall BK-2F may include a polymer resin and a repellent additive. A concentration of the repellent additive included in the second-floor wall BK-2F may be greater than that of the repellent additive included in the first-floor wall BK-1F.

As shown in FIG. 12, the wall BK-6 according to an embodiment may be configured such that the second-floor wall BK-2F is disposed on the wall BK-2 illustrated in FIG. 8.

As shown in FIG. 13, the wall BK-7 according to an embodiment may be configured such that the second-floor wall BK-2F is disposed on the wall BK-5 illustrated in FIG. 11.

However, the present inventive concepts are not limited thereto, and the second-floor wall BK-2F may be disposed on one of the walls BK, BK-1, and BK-3 illustrated in FIGS. 6, 7, and 9.

As shown in FIG. 12, a functional layer may be disposed between the first-floor wall BK-1F and the second-floor wall BK-2F. For example, the spacer layer SP-2 may be provided between the first-floor wall BK-1F and the second-floor wall BK-2F. The present inventive concepts, however, are not limited thereto.

Because the wall bases BK-1F and BK-2F include a multiple layer, the walls BK-6 and BK-7 may be adjusted in height. An increase in height of wall may raise heights of a plurality of color control parts CCP-B, CCP-G, and CCP-R between the walls. Therefore, the display panel DP may increase in luminous efficiency and brightness.

Figure 14:
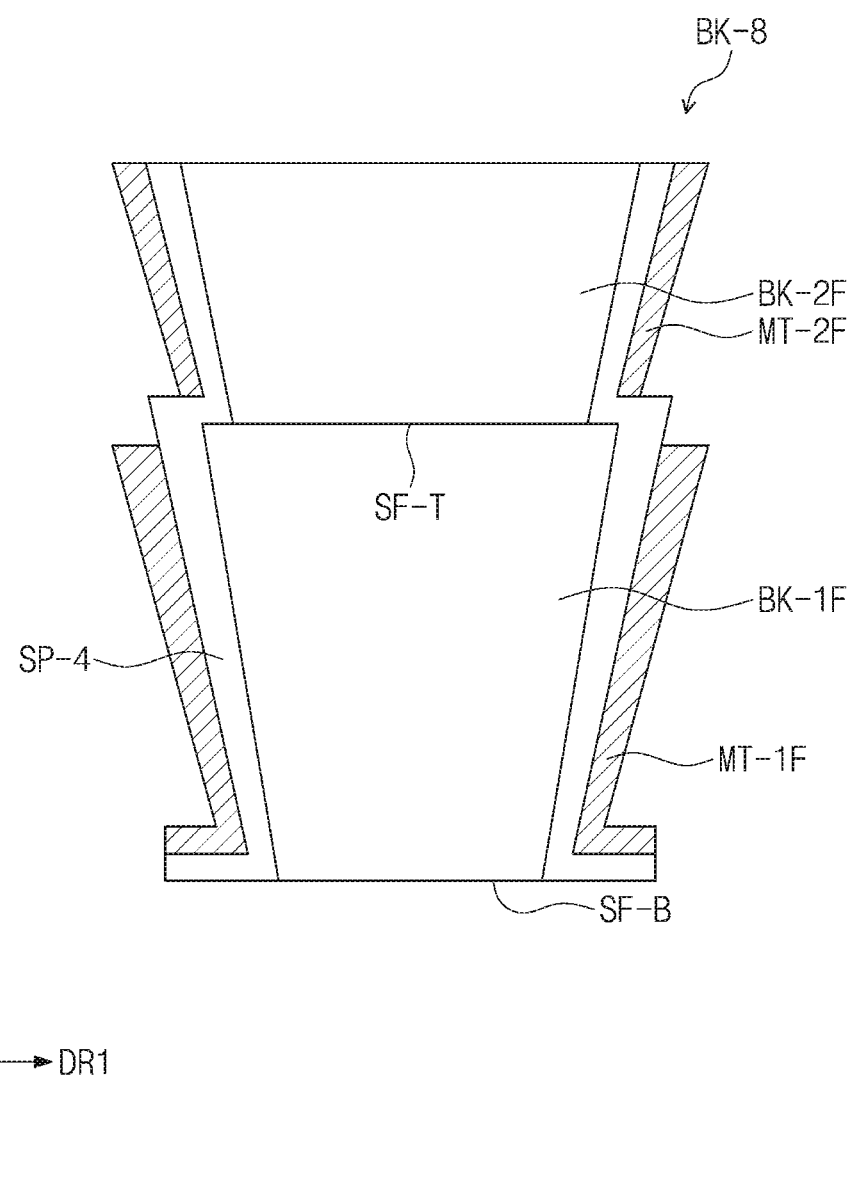
Figure 15:
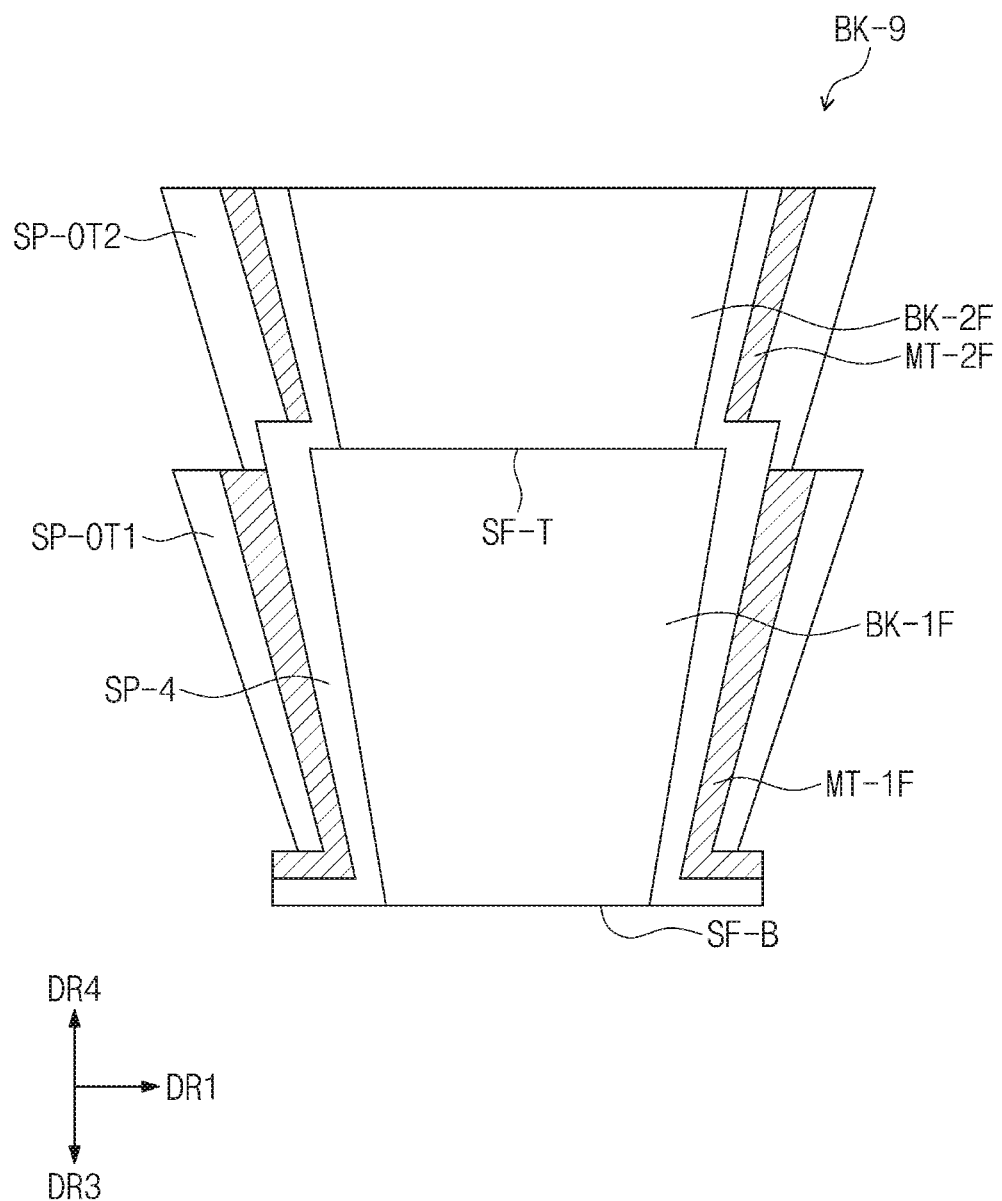

Referring to FIGS. 14 and 15, each of the walls BK-8 and BK-9 according to embodiments may be configured such that the first-floor wall BK-1F and the second-floor wall BK-2F are in contact with each other. For example, the second-floor wall BK-2F may be in direct contact with the second surface SF-T of the first-floor wall BK-1F. In an embodiment, a functional layer may surround sidewalls of all of the first- and second-floor walls BK-1F and BK-2F.

As shown in FIG. 14, the wall BK-8 according to an embodiment may include a spacer layer SP-4, a first-floor reflective layer MT-1F, and a second-floor reflective layer MT-2F. The spacer layer SP-4 may surround the first-floor wall BK-1F and the second-floor wall BK-2F at the same time. The first-floor reflective layer MT-1F may be disposed on the first-floor wall BK-1F and may surround the spacer layer SP-4. The second-floor reflective layer MT-2F may be disposed on the second-floor wall BK-2F and may surround the spacer layer SP-4. The first-floor reflective layer MT-1F and the second-floor reflective layer MT-2F are not directly connected to each other but includes a disconnected portion at a region corresponding to an interface between the first-floor reflective layer MT-1F and a second-floor reflective layer MT-2F.

As shown in FIG. 15, the wall BK-9 according to an embodiment may include a spacer layer SP-4, a first-floor reflective layer MT-1F, a second-floor reflective layer MT-2F, a first-floor outer spacer layer SP-OT1, and a second-floor outer spacer layer SP-OT2. The first-floor outer spacer layer SP-OT1 may be disposed on the first-floor wall BK-1F and may surround the first-floor reflective layer MT-1F. The second-floor outer spacer layer SP-OT2 may be disposed on the second-floor wall BK-2F and may surround the second-floor reflective layer MT-2F. The first-floor outer spacer layer SP-OT1 and the second-floor outer spacer layer SP-OT2 are not directly connected to each other but includes a disconnected portion at a region corresponding to an interface between the first-floor reflective layer MT-1F and a second-floor reflective layer MT-2F. Because the first-floor outer spacer layer SP-OT1 and the second-floor outer spacer layer SP-OT2 respectively surround the first-floor reflective layer MT-1F and second-floor reflective layer MT-2F, the first- and second-floor reflective layers MT-1F and MT-2F may be prevented from being oxidized and the wall BK-9 may increase in reflectance.

FIGS. 16A to 16F illustrate cross-sectional views showing a method of manufacturing a substrate according to an embodiment. The substrate may be the second substrate 200 discussed above.

The method of manufacturing the substrate according to an embodiment may include a step of forming an inorganic layer IN on a base layer BL, a step of forming a plurality of wall bases BK-SB which are disposed spaced apart from each other and which increase in width along a direction perpendicular to the inorganic layer IN on the inorganic layer IN, a step of forming a reflective layer MT which is disposed on the inorganic layer IN and the wall bases BK-SB and which includes metal, a step of forming a spacer layer SP on the inorganic layer IN and the wall bases BK-SB on which the reflective layer MT is formed, a step of removing a portion of the spacer layer SP, and a step of removing a portion of the reflective layer MT.

The sequence of the manufacturing method may be changed according to the structure of a wall BK, and FIGS. 16A to 16F show a method of manufacturing the wall BK of FIG. 6 according to an embodiment.

Figure 16A:
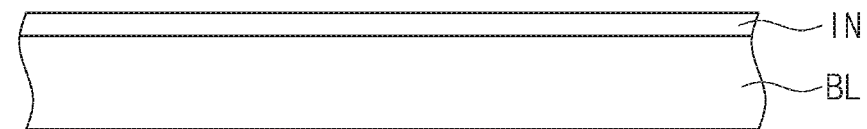
FIGS. 16A, 16B, 16C, 16D, 16E and 16F illustrate cross-sectional views showing a method of manufacturing a substrate according to an embodiment.
Figure 16A:
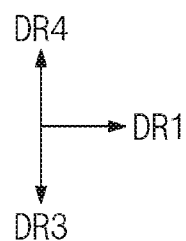

Referring to FIG. 16A, the inorganic layer formation step may include forming the inorganic layer IN including an inorganic material on the base layer BL. The inorganic layer IN may be deposited on the base layer BL using Chemical vapor deposition (CVD). The inorganic layer IN may include at least one of silicon oxide, silicon nitride, silicon oxynitride, ITO, and IZO.

Figure 16B:
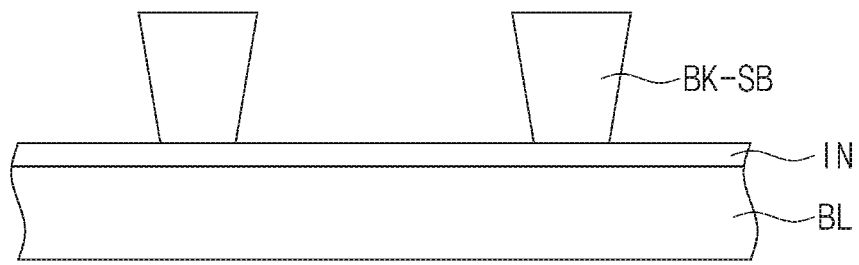
Figure 16B:
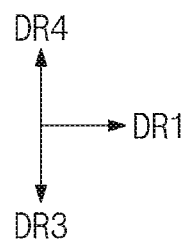

Referring to FIG. 16B, the wall base formation step may form a plurality of wall bases BK-SB that are spaced apart from each other on the inorganic layer IN. The plurality of wall bases BK-SB may be a single wall base connected to one another which has a plurality of openings formed in the single wall base to expose the inorganic layer IN which corresponds to the plurality of color control parts CCP-B, CCP-G, and CCP-R. The wall base BK-SB may include a polymer resin and a repellent additive. The wall base BK-SB may increase in width WD along a direction perpendicular to a surface of the inorganic layer IN. In this description, the width WD may indicate a length in the first direction DR1 on a cross-sectional view of the wall base BK-SB. The wall base BK-SB may be formed by a photoresist process.

Figure 16C:
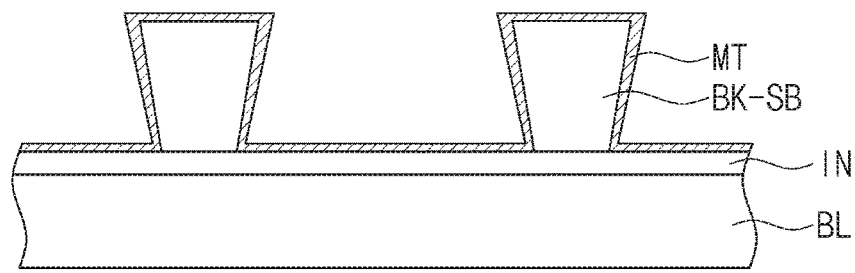
Figure 16C:
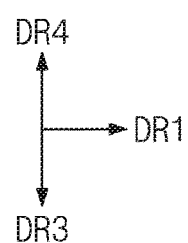

Referring to FIG. 16C, the reflective layer formation step may form the reflective layer MT on the inorganic layer IN and the wall bases BK-SB. The reflective layer MT may include metal. For example, the reflective layer MT may include aluminum.

In an embodiment, the reflective layer MT may be formed using a sputtering process or a CVD process on the inorganic layer IN and the wall bases BK-SB.

Figure 16D:
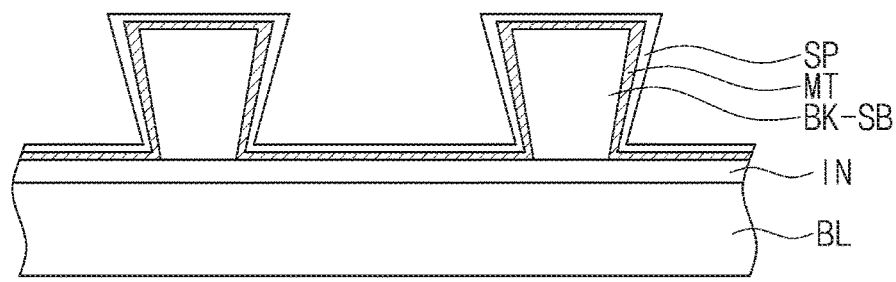
Figure 16D:
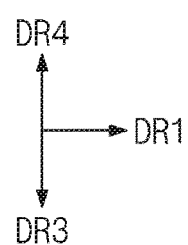

Referring to FIG. 16D, the spacer layer formation step may form the spacer layer SP on the reflective layer MT on the inorganic layer IN and the wall bases BK-SB. The spacer layer SP may include an inorganic material. For example, the spacer layer SP may include at least one of silicon oxide (SiOx), silicon nitride (SiNx), silicon oxynitride (SiOxNy), ITO, and IZO. The spacer layer SP may include, for example, silicon oxide. The spacer layer may be formed using a CVD process. The present inventive concepts, however, are not limited to that discussed above. The spacer layer SP including silicon oxide (SiOx) may have resistance to etching and high transmittance equal to or greater than 95%.

Figure 16E:
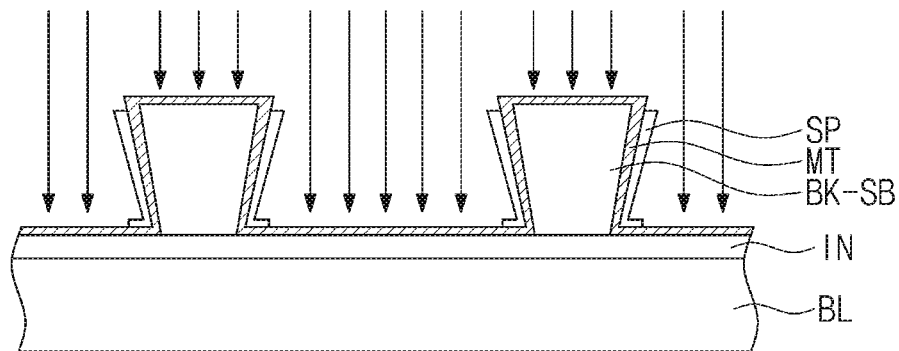
Figure 16E:
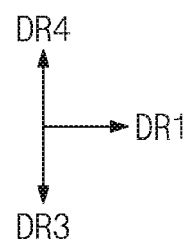

Referring to FIG. 16E, the spacer layer etching step may include that the spacer layer SP is etched in a direction perpendicular to the base layer BL. For example, a dry etching process, for example, Reactive Ion Etching (RIE) may be performed on the spacer layer SP. The dry etching process may be executed in such a way that an etching target is etched by ions, plasma, or radicals. For example, the dry etching process may be a physical etching process which uses the ions, the plasma, or the radicals. The physical etching process may be executed in such a way that an etching target is collided with ions to etch a surface of the etching target.

Unlike wet etching processes, the dry etching process may be an anisotropic etching process. For example, an etching target may be directionally etched in the anisotropic etching process. When the spacer layer SP is anisotropically etched, the spacer layer SP may be etched in a direction perpendicular to the base layer BL. When the wall base BK-SB has a reverse trapezoidal shape according to an embodiment, the anisotropic etching process may remove portions of the spacer layer SP that are disposed on a plurality of wall bases BK-SB and/or portions of the spacer layer SP that are disposed between a plurality of wall bases BK-SB.

Figure 16F:
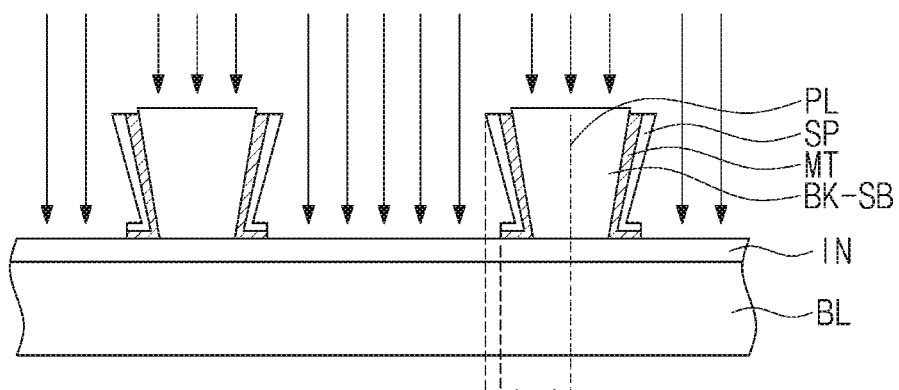
Figure 16F:
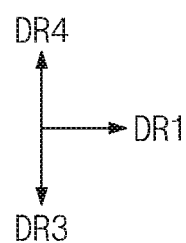

Referring to FIG. 16F, the reflective layer etching step may include that the reflective layer MT is etched in a direction perpendicular to the base layer BL. For example, the reflective layer MT may be etched by a dry etching process or a wet etching process. The dry etching process may be, for example, a physical etching process. For example, a chloride ion (Cl⁻) may react with aluminum (Al) of the reflective layer MT which is exposed, such that a surface of aluminum may be partially removed while aluminum chloride is produced. The wet etching process may use an etchant to etch a surface of an etching target.

According to example embodiment, since the wall base BK-SB has an inverse taper shape, a first length LL1 is longer than a second length LL2. The first length LL1 is a length measured up from a central axis PL of the wall base BK-SB to one end of the first sub-spacer layer SP0-1. The second length LL2 is a length measured up from a central axis PL of the wall base BK-SB to one end of the second sub-spacer layer SP0-2.

A display panel according to an embodiment may be configured such that a wall of an upper display substrate may include a reflective layer and a spacer layer, which may result in an increase in luminous efficiency and an improvement in brightness.

Although the embodiments have been described with reference to a number of illustrative examples thereof, it will be understood by those of ordinary skill in the art that various changes in form and details may be made without departing from the spirit and scope of the present inventive concepts as set forth in the following claims.

Thus, the technical scope of the present inventive concepts is not limited by the embodiments and examples described above, but by the following claims.

What is claimed is:

1. A method of manufacturing a display substrate, the method comprising:
   forming an inorganic layer including an inorganic material on a base layer;
   forming a plurality of wall bases which are spaced apart from each other on the inorganic layer and which increase in width along a direction perpendicular to the inorganic layer;
   forming a reflective layer on the inorganic layer and the plurality of wall bases, the reflective layer including metal;
   forming a spacer layer on the inorganic layer and the plurality of wall bases, the spacer layer including an inorganic material;
   removing the spacer layer disposed on a top of the plurality of wall bases; and
   removing the reflective layer disposed on a top of the plurality of wall bases.

2. The method of claim 1, wherein the reflective layer disposed on the top of the plurality of wall bases is removed by a dry etching or a wet etching.

3. The method of claim 1, wherein the spacer layer disposed on the top of the plurality of wall bases is removed by a dry etching.

4. The method of claim 1, wherein the plurality of wall bases has a height greater than a height of the reflective layer from which the reflective layer disposed on the top of the plurality of wall bases is removed.

5. The method of claim 4, wherein the spacer layer has a height less than the height of the plurality of wall bases.

6. The method of claim 1, wherein the reflective layer is disposed between one of the plurality of wall bases and the spacer layer.

7. The method of claim 1, wherein the spacer layer is disposed between one of the plurality of wall bases and the reflective layer.

8. The method of claim 7, further comprising forming an outer spacer layer which surrounds the reflective layer,
   wherein the reflective layer is disposed between the spacer layer and the outer spacer layer.

9. The method of claim 8, wherein the spacer layer and the outer spacer layer include different materials from each other.

10. The method of claim 1, wherein each of the plurality of wall bases includes:
    a first surface parallel to the base layer;
    a second surface parallel to the first surface and disposed closer than the first surface to the base layer; and
    a third surface that connects the first surface to the second surface,
    wherein the reflective layer and the spacer layer are disposed on the third surface.

11. The method of claim 1, further comprising forming a floor wall on the plurality of wall bases, wherein the floor wall increases in width along the direction perpendicular to the inorganic layer.

12. The method of claim 1, wherein the spacer layer includes at least one of silicon oxide, silicon nitride, silicon oxynitride, indium tin oxide, and indium zinc oxide.

* * * * *